(12) United States Patent
Koyama et al.

(10) Patent No.: US 7,497,912 B2
(45) Date of Patent: Mar. 3, 2009

(54) SUBSTRATE PROCESSING APPARATUS

(75) Inventors: Yasufumi Koyama, Kyoto (JP); Kenji Hashinoki, Kyoto (JP); Takaharu Yamada, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 389 days.

(21) Appl. No.: 10/947,000

(22) Filed: Sep. 22, 2004

(65) Prior Publication Data
US 2005/0061248 A1 Mar. 24, 2005

(30) Foreign Application Priority Data
Sep. 22, 2003 (JP) ............................. 2003-329416

(51) Int. Cl.
C23C 16/00 (2006.01)
H01L 21/306 (2006.01)
C23F 1/00 (2006.01)
B05C 11/00 (2006.01)

(52) U.S. Cl. ...................... 118/719; 118/724; 118/725; 118/729; 118/668; 156/345.24; 156/345.31; 156/345.32; 414/935; 700/121

(58) Field of Classification Search ................ 118/668, 118/676, 686, 698, 708, 719; 414/935–941; 156/345.31, 345.32, 345.24; 700/121
See application file for complete search history.

(56) References Cited

U.S. PATENT DOCUMENTS 5,668,733 A 9/1997 Morimoto et al.
5,687,085 A 11/1997 Morimoto et al.
5,928,389 A * 7/1999 Jevtic ........................ 29/25.01
5,975,740 A * 11/1999 Lin et al. ...................... 700/99
5,980,591 A * 11/1999 Akimoto et al. ............ 29/25.01
6,122,566 A * 9/2000 Nguyen et al. .............. 700/218
6,336,204 B1* 1/2002 Jevtic ............................ 716/1
2002/0081108 A1* 6/2002 Aoki et al. .................. 392/416

FOREIGN PATENT DOCUMENTS

JP 08-153765 6/1996
JP 10-22361 1/1998
JP 2000-340633 12/2000
JP 2001-155992 6/2001
JP 2003-7795 1/2003

* cited by examiner

Primary Examiner—Karla Moore
(74) Attorney, Agent, or Firm—Ostrolenk, Faber, Gerb & Soffen, LLP

(57) ABSTRACT

A cell controller controls the operation of a transport robot to keep a substrate belonging to a succeeding lot carried into a heating part in the fourth transport cycle from being transported out of the heating part in the next or fifth transport cycle, thereby preventing interference between the transport of substrates belonging to the succeeding lot and the transport of substrates belonging to a preceding lot. If interference is likely to occur between the transport of the substrates belonging to the succeeding lot and the transport of the substrates belonging to the preceding lot, the cell controller causes the substrates belonging to the succeeding lot not to be transported but to remain in processing units. This allows the transport of the substrates belonging to the succeeding lot in consideration of only the next transport cycle.

7 Claims, 11 Drawing Sheets

F I G. 5
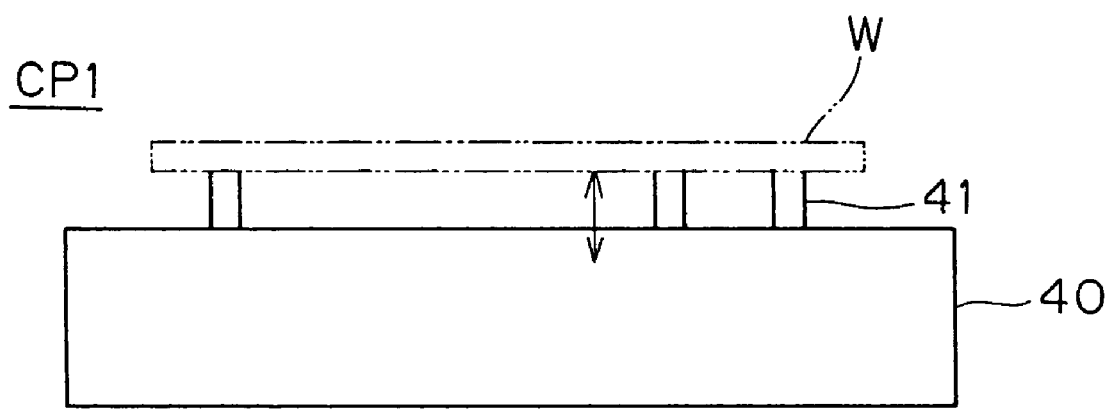

FIG. 9

| LOT A | ① PASS3 | ② PHP1 | ③ CP4 | ④ 15a | ⑤ PASS4 |
|---|---|---|---|---|---|
| LOT B | ① | ② | | | ③ |
| TRANSPORT CYCLE | | | | | |
| 1 | A5 | A4 | A3 | A2 | A1 |
| 2 | A6 | A5 | A4 | A3 | A2 |
| 3 | B1 | A6 | A5 | A4 | A3 |
| 4 | B2 | B1 | A6 | A5 | A4 |
| 5 | B2 | B1 | | A6 | A5 |
| 6 | B2 | B1 | | | A6 |
| 7 | B3 | B2 | | | B1 |
| 8 | B4 | B3 | | | B2 |

FIG. 10

| LOT A | ① PASS3 | ② PHP1 | ③ CP4 | ④ 15a | ⑤ PASS4 |
|---|---|---|---|---|---|
| LOT B | ① | ② | | | ③ |
| TRANSPORT CYCLE | | | | | |
| 1 | A5 | A4 | A3 | A2 | A1 |
| 2 | A6 | A5 | A4 | A3 | A2 |
| 3 | B1 | A6 | A5 | A4 | A3 |
| 4 | | B1 | A6 | A5 | A4 |

F I G. 1 1

| LOT A | ① PASS3 | ② PHP1 | ③ CP4 | ④ 15a | ⑤ PASS4 |
|---|---|---|---|---|---|
| LOT B | ① | ② | | | ③ |
| TRANSPORT CYCLE | | | | | |
| 1 | A5 | A4 | A3 | A2 | A1 |
| 2 | A6 | A5 | A4 | A3 | A2 |
| 3 | B1 | A6 | A5 | A4 | A3 |
| 4 | B2 | B1 | A6 | A5 | A4 |
| 5 | | B2 | | A6 | A5 |
| | | | | | B1 |

F I G. 1 2

| LOT A | ① PASS3 | ② PHP1 | ③ CP4 | ④ 15a | ⑤ PASS4 |
|---|---|---|---|---|---|
| LOT B | ① | ② | | | ③ |
| TRANSPORT CYCLE | | | | | |
| 1 | A5 | A4 | A3 | A2 | A1 |
| 2 | A6 | A5 | A4 | A3 | A2 |
| 3 | B1 | A6 | A5 | A4 | A3 |
| 4 | B2 | B1 | A6 | A5 | A4 |
| 5 | B2 | B1 | | A6 | A5 |
| 6 | | B2 | | | A6 |
| | | | | | B1 |

FIG. 13

| LOT A | ① PASS3 | ② PHP1 | ③ CP4 | ④ 15a | ⑤ PASS4 |
|---|---|---|---|---|---|
| LOT B | ① | ② | | | ③ |
| TRANSPORT CYCLE | | | | | |
| 1 | A5 | A4 | A3 | A2 | A1 |
| 2 | A6 | A5 | A4 | A3 | A2 |
| 3 | B1 | A6 | A5 | A4 | A3 |
| 4 | B2 | B1 | A6 | A5 | A4 |
| 5 | B2 | B1 | | A6 | A5 |
| 6 | B2 | B1 | | | A6 |
| 7 | | B2 | | | B1 |

FIG. 14

| LOT A | ① ID | ② HP | ③ CP | ④ SC | ⑤ ID |
|---|---|---|---|---|---|
| LOT B | ① | ② | | | ③ |
| TRANSPORT CYCLE | | | | | |
| 1 | A5 | A4 | A3 | A2 | A1 |
| 2 | A6 | A5 | A4 | A3 | A2 |
| 3 | | A6 | A5 | A4 | A3 |
| 4 | | | A6 | A5 | A4 |
| 5 | B1 | | | A6 | A5 |
| 6 | B2 | B1 | | | A6 |
| 7 | B3 | B2 | | | B1 |
| 8 | B4 | B3 | | | B2 |

SUBSTRATE PROCESSING APPARATUS

BACKGROUND OF THE INVENTION

1. Field of the Invention

The present invention relates to a substrate processing apparatus for performing a predetermined process on substrates (or wafers) including a semiconductor substrate, a glass substrate for a liquid crystal display device, a glass substrate for a photomask, a substrate for an optical disk and the like.

2. Description of the Background Art

There has been proposed a substrate processing method known as a "flex flow" which is capable of efficiently successively processing a plurality of lots different in transport sequence (or process flow) in a substrate processing apparatus for performing a series of processes on substrates by transporting the substrates to a plurality of processing units.

The conventional flex flow technique reduces time loss by connecting the processes of successive lots A and B different in transport sequence to each other without interruption under conditions of no interference between the process of the lot A loaded earlier and the process of the lot B loaded later if there is a processing unit (e.g., a heating processing unit) the use of which is shared between the lots A and B. An example of the conventional flex flow technique is disclosed in Japanese Patent Application Laid-Open No. 7-283094 (1995). A lot loaded earlier is referred to hereinafter as a "preceding lot," and a lot loaded immediately subsequently to the preceding lot is referred to hereinafter as a "succeeding lot."

A typical substrate processing apparatus comprises an indexer for carrying a substrate into and out of a cassette. A substrate transfer position is established in the indexer, and a substrate in a cassette is placed in the transfer position. A transport robot for transporting a substrate to processing units receives the substrate in the transfer position, circulates among the processing units while carrying substrates into and out of each processing unit and transporting a substrate to the next processing unit, and then returns to the transfer position again. The conventional flex flow technique controls the timing of the transport of substrates from a cassette to the transfer position to control the timing of the transfer of the substrates from the cassette to the transport robot, thereby processing the successive lots A and B without interruption. The substrate transport control in the conventional flex flow is described with reference to FIG. 14.

FIG. 14 shows an example of substrate transport cycles in the conventional flex flow. The reference characters "ID," "HP," "CP," and "SC" designate an indexer, a heating processing unit, a cooling processing unit, and a resist coating processing unit, respectively. The term "transport cycle" refers to a cycle of operation during which the transport robot starting from the substrate transfer position in the indexer circulates among the processing units and then returns to the substrate transfer position again.

Substrates A1 to A6 belonging to the preceding lot A are subjected to a series of processes by following a transport sequence such that each substrate is carried out of the indexer, transported to the heating processing unit, the cooling processing unit, the resist coating processing unit in the order named, and then carried into the indexer. Substrates B1 to B4 belonging to the succeeding lot B are subjected to only a heating process by following a transport sequence such that each substrate is carried out of the indexer, transported to the heating processing unit, and then carried into the indexer.

In the second transport cycle (denoted as "2") as shown in FIG. 14, the transport robot receives the substrate A5 belonging to the preceding lot A placed in the transfer position in the indexer, and transports the substrate A5 to the heating processing unit. Because the substrate A4 is present in the heating processing unit at this time, the substrate A5 is carried into the heating processing unit after the substrate A4 is carried out of the heating processing unit. The transport robot transports the substrate A4 carried out of the heating processing unit to the cooling processing unit, and changes places between the substrate A3 present in the cooling processing unit and the substrates A4 transported by the transport robot. Next, the transport robot transports the substrate A3 carried out of the cooling processing unit to the resist coating processing unit, and changes places between the substrate A2 present in the resist coating processing unit and the substrate A3 transported by the transport robot. Then, the transport robot places the substrate A2 carried out of the resist coating processing unit in the transfer position in the indexer. After receiving the substrate A2 subjected to a series of processes, the indexer stores the substrate A2 into a cassette. Then, the indexer takes the last substrate A6 belonging to the preceding lot out of the cassette to place the substrate A6 in the transfer position.

In the third transport cycle (denoted as "3" in FIG. 14), the transport robot receives the substrate A6 placed in the transfer position in the indexer, transports the substrate A6 to the heating processing unit, and changes places between the substrate A6 and the substrate A5 present in the heating processing unit. The transport robot transports the substrate A5 carried out of the heating processing unit to the cooling processing unit, and changes places between the substrate A5 and the substrate A4 present in the cooling processing unit. Then, the transport robot transports the substrate A4 carried out of the cooling processing unit to the resist coating processing unit, and changes places between the substrate A4 and the substrate A3 present in the resist coating processing unit. Next, the transport robot places the substrate A3 carried out of the resist coating processing unit in the transfer position in the indexer. After receiving the processed substrate A3, the indexer stores the substrate A3 into the cassette.

Thereafter, the indexer unconditionally takes a substrate out of the cassette and places the substrate in the transfer position if the substrate belongs to the same lot as its preceding substrate. However, the substrate to be processed next is a substrate belonging to the succeeding lot B different in transport sequence from the preceding lot A. This creates a possibility that transferring the first substrate B1 belonging to the lot B subsequently to the substrate A6 to the transport robot causes interference between the transport of the substrate B1 and the transport of the substrates belonging to the lot A in the subsequence transport cycles. To prevent the interference, a controller (referred to hereinafter as a "transport controller") for controlling the transport of the substrates in the substrate processing apparatus performs the virtual transport of the first substrate B1 belonging to the lot B to judge whether or not the interference between the transport of the substrate B1 and the transport of the substrates belonging to the preceding lot A occurs before the completion of all transport of the substrate B1 in a previously determined transport sequence. Based on the result of the judgment, the transport controller controls the actual transport of the substrates.

In this example, if the assumption is made that the substrate B1 is placed subsequently to the substrate A6 in the transfer position, the transport robot receives the substrate B1 and transports the substrate B1 to the heating processing unit in the fourth transport cycle (denoted as "4" in FIG. 14). Because no substrates belonging to the preceding lot A are transported to the heating processing unit in the fourth transport cycle, no interference occurs between the transport of the substrate B1 and the transport of the substrates belonging to the preceding lot A. Further virtual transport of the substrate B1 results in the transport of the substrate B1 into the indexer in the fifth transport cycle (denoted as "5" in FIG. 14). In the fifth transport cycle, the interference occurs between the transport of the substrate B1 and the transport of the substrate A5 belonging to the preceding lot A because the substrate A5 is transported into the indexer.

The transport controller performs the above-mentioned virtual transport therein to judge whether or not the interference occurs between the transport of the substrate B1 and the transport of the substrates belonging to the preceding lot A. In the above-mentioned example, because the virtual transport of the substrate B1 subsequent to the substrate A6 results in the interference in the fifth transport cycle, the transport controller causes the indexer to stop taking the substrate B1 out of the cassette, and executes the actual fourth transport cycle.

In the actual fourth transport cycle, the transport robot, which can receive no substrate from the indexer, transports no substrate to the heating processing unit, but takes the substrate A6 out of the heating processing unit and transports the substrate A6 to the cooling processing unit. The transport robot changes places between the substrate A6 and the substrate A5 present in the cooling processing unit, and transports the substrate A5 to the resist coating processing unit. Then, the transport robot changes places between the substrate A5 and the substrate A4 present in the resist coating processing unit, and transports the substrate A4 to the indexer. After receiving the substrate A4, the indexer stores the substrate A4 into the cassette.

Prior to the start of the fifth transport cycle, the transport controller performs the virtual transport of the substrate B1 belonging to the lot B again to judge whether or not the interference between the transport of the substrate B1 and the transport of the substrates belonging to the preceding lot A occurs before the completion of all transport of the substrate B1. In this step, if the assumption is made that the substrate B1 is taken out of the cassette and placed in the transfer position, the transport robot receives the substrate B1 and transports the substrate B1 to the heating processing unit in the fifth transport cycle. Because no substrates belonging to the preceding lot A are transported to the heating processing unit in the fifth transport cycle, no interference occurs between the transport of the substrate B1 and the transport of the substrates belonging to the preceding lot A. Further virtual transport of the substrate B1 results in the transport of the substrate B1 into the indexer in the sixth transport cycle (denoted as "6" in FIG. 14). In the sixth transport cycle, the interference occurs between the transport of the substrate B1 and the transport of the substrate A6 belonging to the preceding lot A because the substrate A6 is transported into the indexer. Therefore, the transport controller causes the indexer to stop taking the substrate B1 out of the cassette again, and executes the actual fifth transport cycle.

In the actual fifth transport cycle, after the substrate A5 taken out of the resist coating processing unit is carried into the indexer, the indexer stores the substrate A5 into the cassette. In this step, the transport controller performs the virtual transport of the substrate B1 belonging to the succeeding lot B again to judge whether or not the interference occurs between the transport of the substrate B1 and the transport of the substrates belonging to the preceding lot A. In this example, if the assumption is made that the substrate B1 is taken out of the cassette and placed in the transfer position, the substrate B1 is transported to the heating processing unit in the sixth transport cycle. Because no substrates belonging to the preceding lot A are transported to the heating processing unit in the sixth transport cycle, no interference occurs between the transport of the substrate B1 and the transport of the substrates belonging to the preceding lot A. Further virtual transport of the substrate B1 results in the transport of the substrate B1 into the indexer in the seventh transport cycle (denoted as "7" in FIG. 14). In the seventh transport cycle, no substrates belonging to the preceding lot A are transported to the indexer, because the last substrate A6 belonging to the preceding lot A is carried into the indexer in the sixth transport cycle. Therefore, no interference occurs between the transport of the substrate B1 and the transport of the substrate A6.

In this manner, if the virtual transport of the substrate B1 to the final destination results in no interference between the transport of the substrate B1 and the substrates belonging to the preceding lot A, the transport controller allows the indexer to take out the substrate B1, and executes the actual sixth transport cycle.

In the sixth transport cycle, the transport robot receives the substrate B1 from the transfer position and transports the substrate B1 to the heating processing unit. Next, the transport robot moves to the resist coating processing unit in which the last substrate A6 belonging to the preceding lot A is present, takes the substrate A6 out of the resist coating processing unit, and carries the substrate A6 into the indexer. The indexer stores the substrate A6 into the cassette. Then, the indexer takes the next substrate B2 out of the cassette and places the substrate B2 in the transfer position.

In the seventh transport cycle, the transport robot receives the substrate B2 from the indexer and transports the substrate B2 to the heating processing unit. Then, the transport robot changes places between the substrate B2 and the substrates B1 present in the heating processing unit, and carries the substrate B1 into the indexer. The indexer stores the substrate B1 into the cassette, and takes the substrate B3 out of the cassette. Thereafter, a similar operation is repeated.

As described above, the conventional substrate processing apparatus controls the timing of the transfer of the substrates to the transport robot to achieve the flex flow. For the actual transport of the first substrate belonging to the succeeding lot, it is necessary to consider the transport cycles required until the completion of all transport of the first substrate belonging to the succeeding lot. This increases the complexity of the substrate transport control in the substrate processing apparatus, thereby to make the substrate processing apparatus more likely to malfunction.

SUMMARY OF THE INVENTION

It is an object of the present invention to provide a technique capable of simplifying the control of the transport of substrates in an apparatus.

According to the present invention, a substrate processing apparatus comprises: a plurality of locations to which substrates are transported; a transport element for circulatingly transporting preceding substrates and succeeding substrates successively between the plurality of locations, the preceding substrates belonging to a preceding lot determined to follow a first transport sequence, the succeeding substrates belonging to a succeeding lot determined to follow a second transport sequence different from the first transport sequence, the preceding lot being immediately followed by the succeeding lot; and an operation control element for controlling the operation of the transport element, wherein the plurality of locations include one or more processing units each for performing a predetermined process on a substrate, and wherein the operation control element includes a judging element for making a predictive judgment as to whether or not interference occurs between the transport of the succeeding substrates and the transport of the preceding substrates in a new transport cycle, based on information representing the first and second transport sequences, an objective substrate determining element for determining an objective substrate, the objective substrate being one of the succeeding substrates occupying one of the one or more processing units and causing the interference when transported out of the one processing unit, if the interference is predicted, and a transport cycle correcting element for executing the new transport cycle while causing the objective substrate to remain in the one processing unit.

If a prediction is made that the transport of the succeeding substrates will interfere with the transport of the preceding substrates in the new transport cycle, the succeeding substrate which will cause the interference is not transported out of the one processing unit but is caused to remain in the one processing unit in the new transport cycle. Thus, only judging whether or not the transport of the succeeding substrates interferes with the transport of the preceding substrates in the next transport cycle is required to allow the transport of the succeeding substrates. This simplifies the transport control in the substrate processing apparatus, as compared with a method of controlling the transport of substrates in consideration of not only the next transport cycle but also transport cycles required until all of the transport of the succeeding substrates is completed. Consequently, the present invention reduces the malfunctions of the substrate processing apparatus to improve the reliability thereof.

Preferably, the substrate processing apparatus further comprises a repeating element for activating the judging element each time a transport cycle is updated.

Preferably, after a leading substrate belonging to the succeeding lot reaches the last one of the plurality of locations, the operation control element causes other substrates belonging to the succeeding lot to be transported in succession.

Preferably, the substrate processing apparatus further comprises a first substrate rest part, wherein the plurality of locations include a second substrate rest part, and wherein the transport element transports a substrate placed on the first substrate rest part to the plurality of locations, and places a substrate processed in the one or more processing units onto the second substrate rest part.

The first substrate rest part on which a substrate to be transported to the locations by the transport element is placed and the second substrate rest part on which a substrate subjected to a process in the processing unit is placed are individually provided in the substrate processing apparatus. This allows a processed substrate to be placed on the second substrate rest part if a substrate remains in the processing unit and a substrate on the first substrate rest part is not taken out by the transport element. This insures the transfer of the processed substrate to another processing part if a substrate remains in the processing unit.

Preferably, the one or more processing units include a heating part, the heating part including a heating element for performing a heating process on a substrate transported thereto, and a holding arm for holding the substrate heated by the heating element to perform a cooling process on the substrate.

The heating part, which includes the holding arm having a cooling function, can immediately cool a substrate heated by the heating element. Thus, if a substrate remains in the heating part without being transported therefrom, the substrate is prevented from being left uncooled after being heated. This improves the quality of the heating process which requires precise management of heating time, such as a heating process immediately after a resist coating process and a heating process immediately after an exposure process.

The present invention is also intended for an apparatus for determining a transport plan for substrates in a substrate processing apparatus. According to the present invention, the apparatus comprises: an element for acquiring a transport plan about the transport of preceding substrates and succeeding substrates between a plurality of locations, the preceding substrates belonging to a preceding lot determined to follow a first transport sequence, the succeeding substrates belonging to a succeeding lot determined to follow a second transport sequence different from the first transport sequence, the preceding lot being immediately followed by the succeeding lot; an element for judging whether or not interference occurs between the transport of the succeeding substrates and the transport of the preceding substrates under the transport plan; an element for determining an objective substrate, the objective substrate being one of the succeeding substrates occupying a processing unit and causing the interference when transported out of the processing unit, if the interference is predicted; and an element for correcting the transport plan so as to execute a new transport cycle while causing the objective substrate to remain in the processing unit.

The present invention is also intended for a method of preventing a plurality of substrates from interfering with each other in a substrate processing apparatus. According to the present invention, the method comprises the steps of: specifying a transport cycle including the transport of a first substrate belonging to a preceding lot and a second substrate belonging to a succeeding lot, the preceding lot being immediately followed by the succeeding lot; predicting substrate-interference in the transport cycle; and changing the transport cycle so as to transport the first substrate while causing the second substrate to remain in a processing unit, thereby preventing the substrate-interference.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a side view showing a construction of a cooling processing unit according to the preferred embodiment of the present invention;

FIG. 9 shows transport cycles in the substrate processing apparatus according to the preferred embodiment of the present invention;

FIGS. 10 to 13 show virtual transport cycles in the substrate processing apparatus according to the preferred embodiment of the present invention; and FIG. 14 shows transport cycles in a conventional substrate processing apparatus.

DESCRIPTION OF THE PREFERRED EMBODIMENTS

A preferred embodiment according to the present invention will now be described in detail with reference to the drawings.

Figure 1:
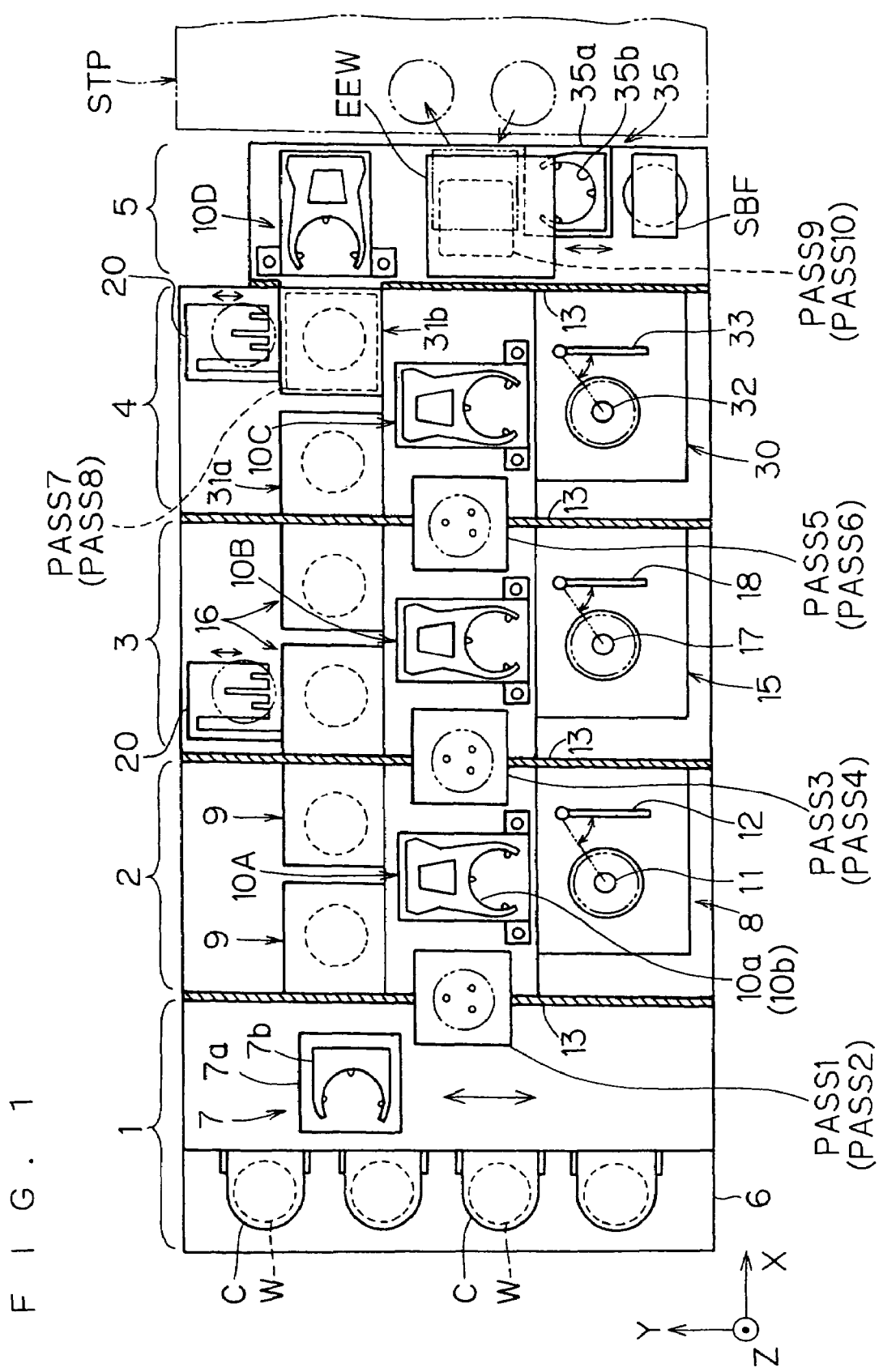
FIG. 1 is a plan view of a substrate processing apparatus according to a preferred embodiment of the present invention.
Figure 2:
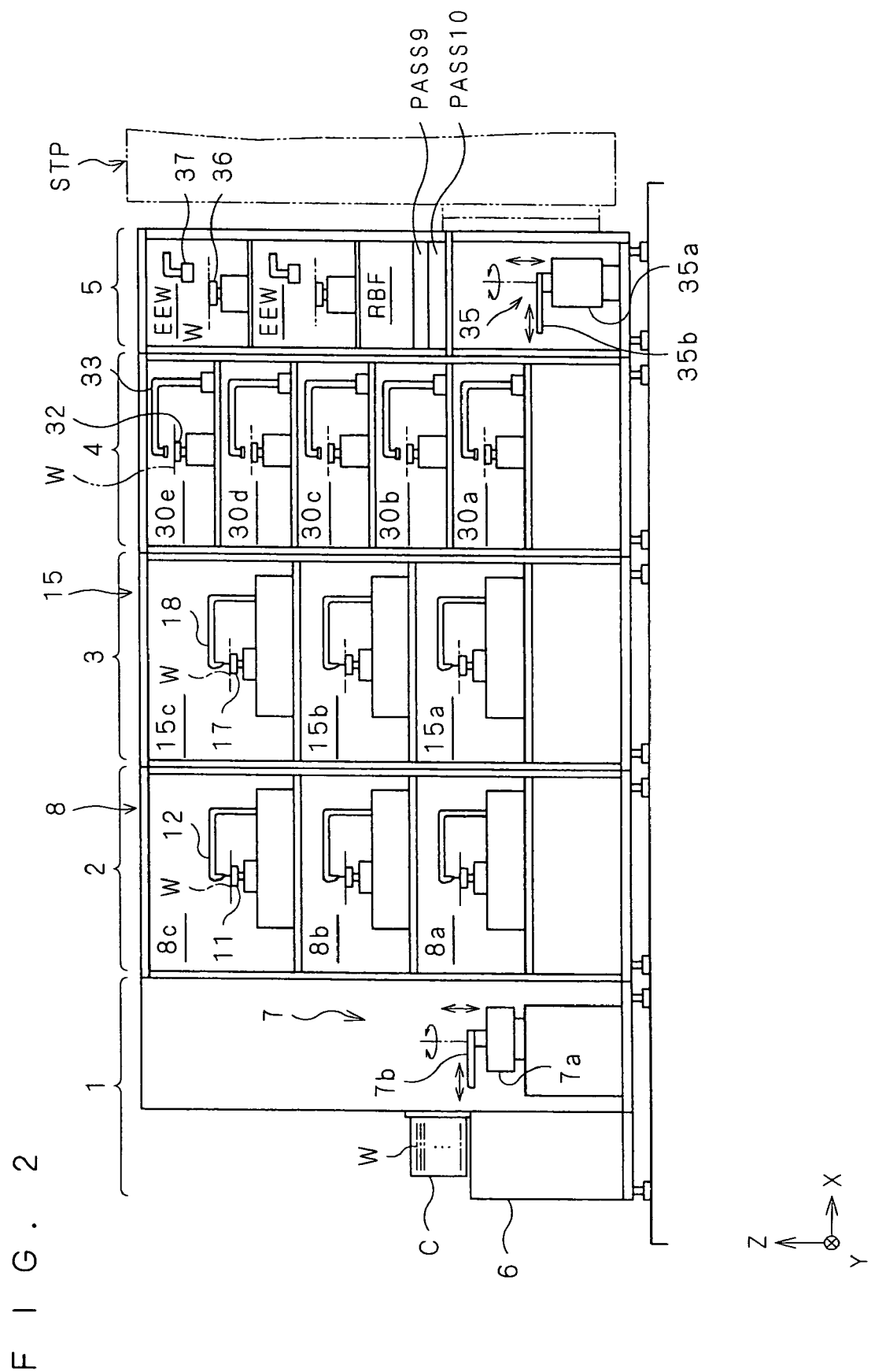
FIG. 2 is a front view of a chemical processor according to the preferred embodiment of the present invention.
Figure 3:
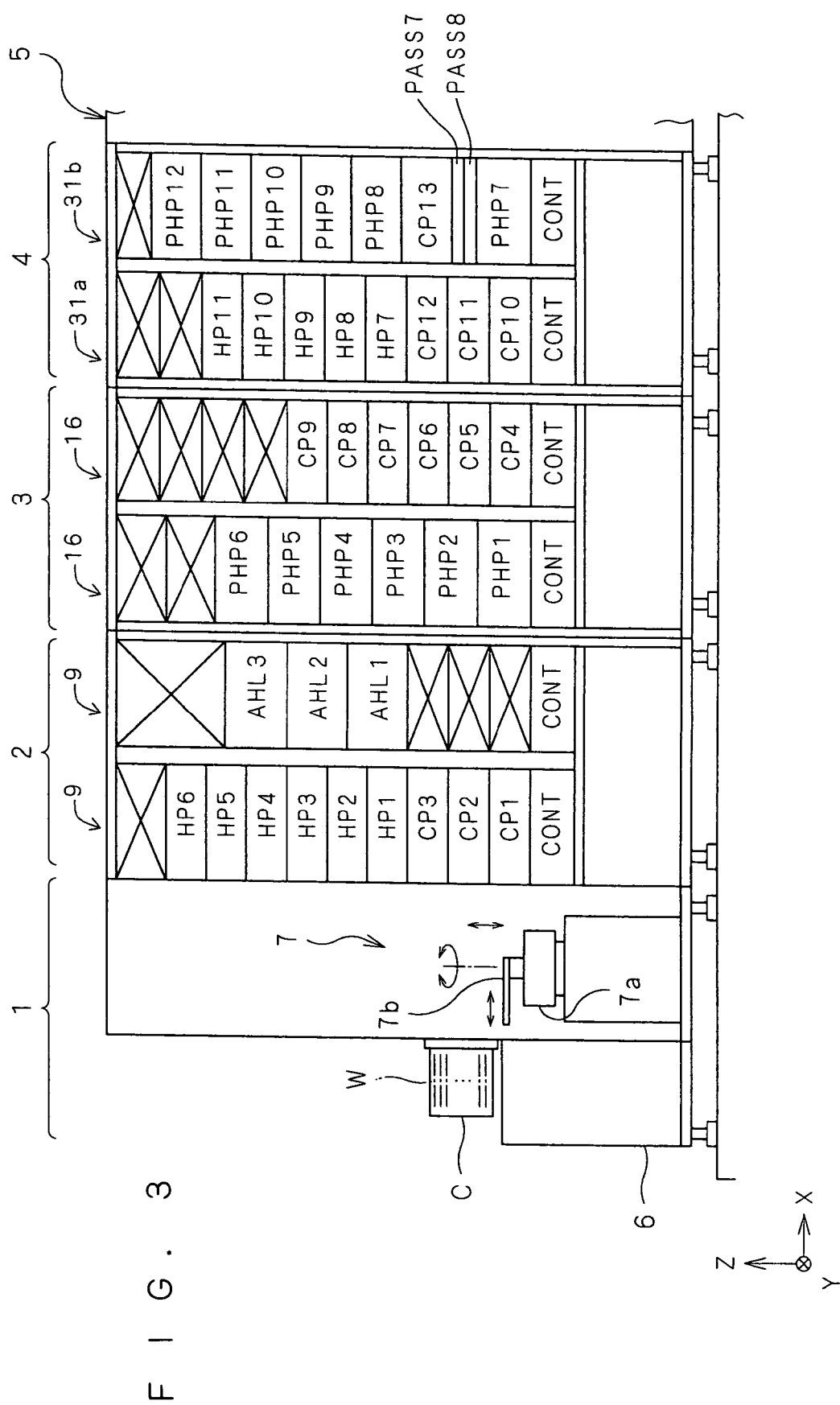
FIG. 3 is a front view of a thermal processor according to the preferred embodiment of the present invention.
Figure 4:
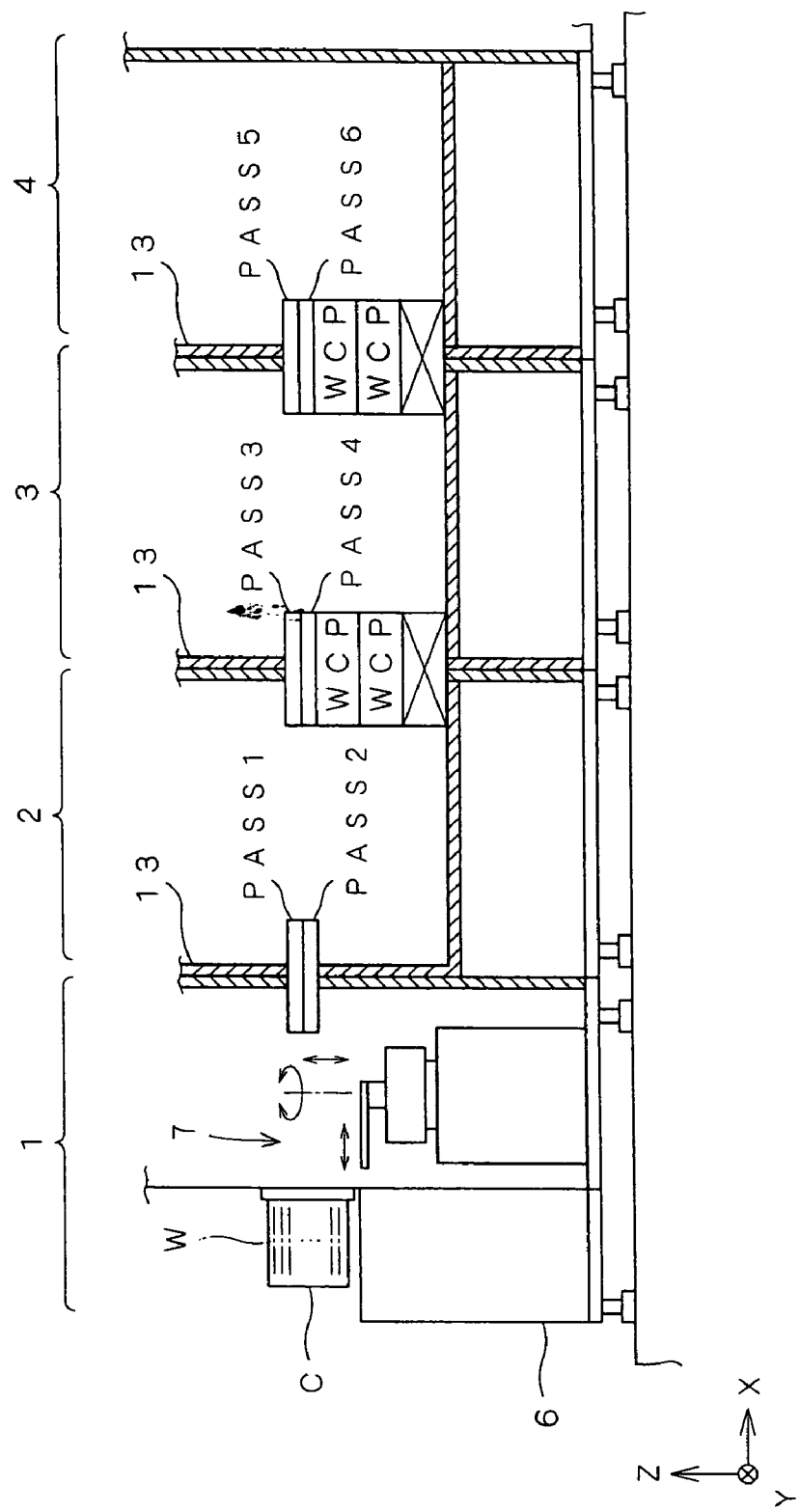
FIG. 4 shows a construction around substrate rest parts in the substrate processing apparatus according to the preferred embodiment of the present invention.

FIG. 1 is a top plan view of a substrate processing apparatus according to the preferred embodiment of the present invention. FIG. 2 is a front view of a chemical processor in the substrate processing apparatus. FIG. 3 is a front view of a thermal processor in the substrate processing apparatus. FIG. 4 shows a construction around substrate rest parts in the substrate processing apparatus. An XYZ rectangular coordinate system which defines the direction of the Z axis as the vertical direction is additionally shown in FIGS. 1 to 4.

The substrate processing apparatus according to the preferred embodiment is an apparatus for forming an anti-reflection film and a photoresist film on substrates such as semiconductor wafers by coating and for performing a development process on substrates subjected to a pattern exposure process. The substrates to be processed by the substrate processing apparatus according to the present invention are not limited to semiconductor wafers, but may include glass substrates for a liquid crystal display device, and the like. The specific processing of the substrate processing apparatus according to the present invention is not limited to the coating film formation and the development process, but may include an etching process and a cleaning process.

The substrate processing apparatus according to the preferred embodiment comprises an indexer block 1, a BARC (bottom anti-reflection coating) block 2, a resist coating block 3, a development processing block 4, and an interface block 5. In the substrate processing apparatus, the five processing blocks 1 to 5 are arranged in side-by-side relation. An exposure apparatus (or stepper) STP which is an external apparatus separate from the substrate processing apparatus according to the present invention is provided and connected to the interface block 5.

The indexer block 1 comprises a table 6 for placing thereon a plurality of (in this preferred embodiment, four) cassettes C in juxtaposition, and a substrate transfer mechanism 7 for taking an unprocessed substrate W out of each of the cassettes C and for storing a processed substrate W into each of the cassettes C. The substrate transfer mechanism 7 includes a movable base 7a movable horizontally (in the Y direction) along the table 6, and a holding arm 7b mounted on the movable base 7a and for holding a substrate W in a horizontal position. The holding arm 7b is capable of moving vertically (in the Z direction) over the movable base 7a, pivoting within a horizontal plane and moving back and forth in the direction of the pivot radius. Thus, the substrate transfer mechanism 7 can cause the holding arm 7b to gain access to each of the cassettes C, thereby taking an unprocessed substrate W out of each cassette C and storing a processed substrate W into the cassette C. The cassettes C may be of the following types: an SMIF (standard mechanical interface) pod, and an OC (open cassette) which exposes stored substrates W to the atmosphere, in addition to a FOUP (front opening unified pod) which stores substrates W in an enclosed or sealed space.

The BARC block 2 is provided in adjacent relation to the indexer block 1. A partition 13 for closing off the communication of atmosphere is provided between the indexer block 1 and the BARC block 2. The partition 13 is provided with a pair of vertically arranged substrate rest parts PASS1 and PASS2 each for placing a substrate W thereon for the transfer of the substrate W between the indexer block 1 and the BARC block 2.

The upper substrate rest part PASS1 is used for the transport of a substrate W from the indexer block to the BARC block 2. The substrate rest part PASS1 includes three support pins. The substrate transfer mechanism 7 of the indexer block 1 places an unprocessed substrate W taken out of one of the cassettes C onto the three support pins of the substrate rest part PASS1. A transport robot 10A of the BARC block 2 to be described later receives the substrate W placed on the substrate rest part PASS1. The lower substrate rest part PASS2, on the other hand, is used for the transport of a substrate W from the BARC block 2 to the indexer block 1. The substrate rest part PASS2 also includes three support pins. The transport robot 10A of the BARC block 2 places a processed substrate W onto the three support pins of the substrate rest part PASS2. The substrate transfer mechanism 7 receives the substrate W placed on the substrate rest part PASS2 and stores the substrate W into the cassette C. Pairs of substrate rest parts PASS3 to PASS10 to be described later are similar in construction to the pair of substrate rest parts PASS1 and PASS2.

As shown in FIG. 4, the substrate rest parts PASS1 and PASS2 extend through the partition 13. Each of the substrate rest parts PASS1 and PASS2 includes an optical sensor (not shown) for detecting the presence or absence of a substrate W thereon. Based on a detection signal from each of the sensors, a judgment is made as to whether or not the substrate transfer mechanism 7 and the transport robot 10A of the BARC block 2 stand ready to transfer and receive a substrate W to and from the substrate rest parts PASS1 and PASS2.

Next, the BARC block 2 will be described. The BARC block 2 is a processing block for forming an anti-reflection film by coating at the bottom of a photoresist film (i.e., as an undercoating film for the photoresist film) to reduce standing waves or halation occurring during exposure. The BARC block 2 comprises a bottom coating processor 8 for coating the surface of a substrate W with the anti-reflection film, a pair of thermal processing towers 9 for performing a thermal process which accompanies the formation of the anti-reflection film by coating, and the transport robot 10A for transferring and receiving a substrate W to and from the bottom coating processor 8 and the pair of thermal processing towers 9.

In the BARC block 2, the bottom coating processor 8 and the pair of thermal processing towers 9 are arranged on opposite sides of the transport robot 10A. Specifically, the bottom coating processor 8 is on the front side of the substrate processing apparatus, and the pair of thermal processing towers 9 are on the rear side thereof. Additionally, a thermal barrier not shown is provided on the front side of the pair of thermal processing towers 9. Thus, the thermal effect of the pair of thermal processing towers 9 upon the bottom coating processor 8 is avoided by spacing the bottom coating processor 8 apart from the pair of thermal processing towers 9 and by providing isolation therebetween using the thermal barrier.

As shown in FIG. 2, the bottom coating processor 8 includes three coating processing units 8a to 8c similar in construction to each other and arranged in stacked relation in bottom-to-top order. Each of the coating processing units 8a to 8c includes a spin chuck 11 for rotating a substrate W in a substantially horizontal plane while holding the substrate W in a substantially horizontal position under suction, a coating nozzle 12 for applying a coating solution for the anti-reflection film onto the substrate W held on the spin chuck 11, and a cup (not shown) surrounding the substrate W held on the spin chuck 11.

As shown in FIG. 3, one of the thermal processing towers 9 which is closer to the indexer block 1 includes six heating processing units HP1 to HP6 for heating a substrate W up to a predetermined temperature, and cooling processing units CP1 to CP3 for setting and maintaining a substrate W at a predetermined temperature close to room temperature. The cooling processing units CP1 to CP3 and the heating processing units HP1 to HP6 are arranged in stacked relation in bottom-to-top order in this thermal processing tower 9. The other of the thermal processing towers 9 which is farther from the indexer block 1 includes three adhesion promotion processing units AHL1 to AHL3 arranged in stacked relation in bottom-to-top order for thermally processing a substrate W in a vapor atmosphere of HMDS (hexamethyl disilazane) to promote the adhesion of the photoresist film to the substrate W.

FIG. 5 is a side view showing a structure of the cooling processing unit CP1. The cooling processing units CP2, CP3, and cooling processing units CP4 to CP13 to be described later are similar in construction to the cooling processing unit CP1 shown in FIG. 5.

With reference to FIG. 5, the cooling processing unit CP1 includes a plate 40 set at the predetermined temperature close to room temperature, and a plurality of movable support pins 41 extendable out of and retractable into the upper surface of the plate 40. The movable support pins 41 have respective upper end surfaces which support the lower surface of a substrate W. The movable support pins 41 move downwardly to retract into the plate 40, whereby the substrate W is placed on the plate 40. The movable support pins 41 move upwardly to extend out of the upper surface of the plate 40, thereby lifting the substrate W so that the substrate W is spaced apart from the plate 40.

Because such a construction is employed, when the temperature of the plate 40 is set, for example, at 25° C. and the substrate W is placed on the plate 40, the heated substrate W is cooled, and the substrate temperature is set at 25° C. For the substrate W already cooled down to a temperature close to room temperature, the substrate temperature is set exactly at 25° C. So long as the substrate W is placed on the plate 40, the substrate temperature is maintained at 25° C.

Heater controllers CONT for controlling the temperatures of the thermal processing units (the heating processing unit HP1 to HP6, the cooling processing units CP1 to CP3, and the adhesion promotion processing units AHL1 to AHL3) are provided on the lowermost ends of the respective thermal processing towers 9. The locations indicated by the cross marks (x) in FIG. 3 are occupied by a piping and wiring section or reserved as empty space for future addition of processing units.

Thus, stacking the coating processing units 8*a* to 8*c* and the thermal processing units in tiers provides smaller space occupied by the substrate processing apparatus to reduce the footprint thereof. The side-by-side arrangement of the pair of thermal processing towers 9 is advantageous in facilitating the maintenance of the thermal processing units and in eliminating the need for extension of ducting and power supply equipment necessary for the thermal processing units to a much higher position.

Figure 6A:
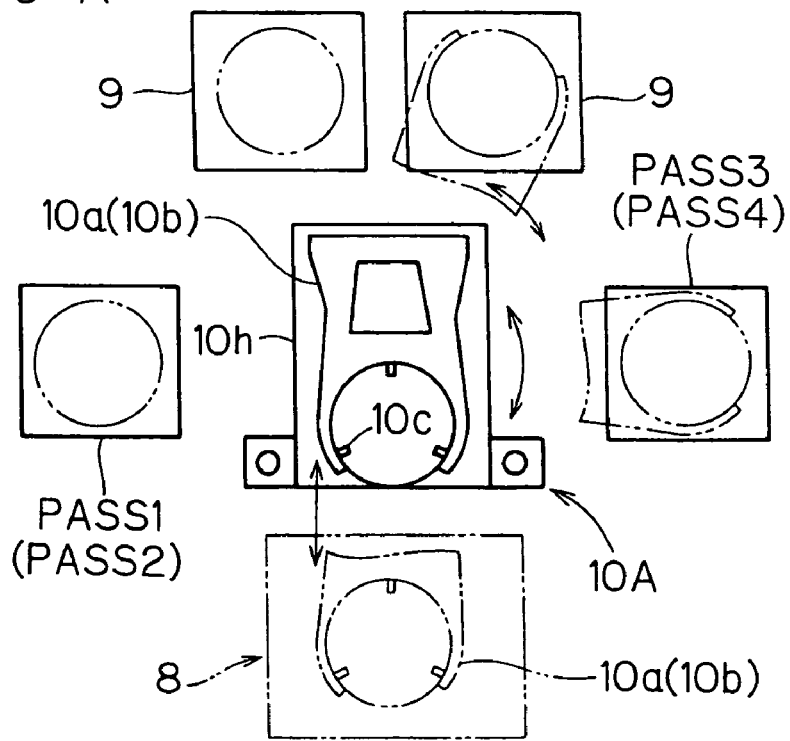
FIGS. 6A and 6B show a construction of a transport robot according to the preferred embodiment of the present invention.
Figure 6B:
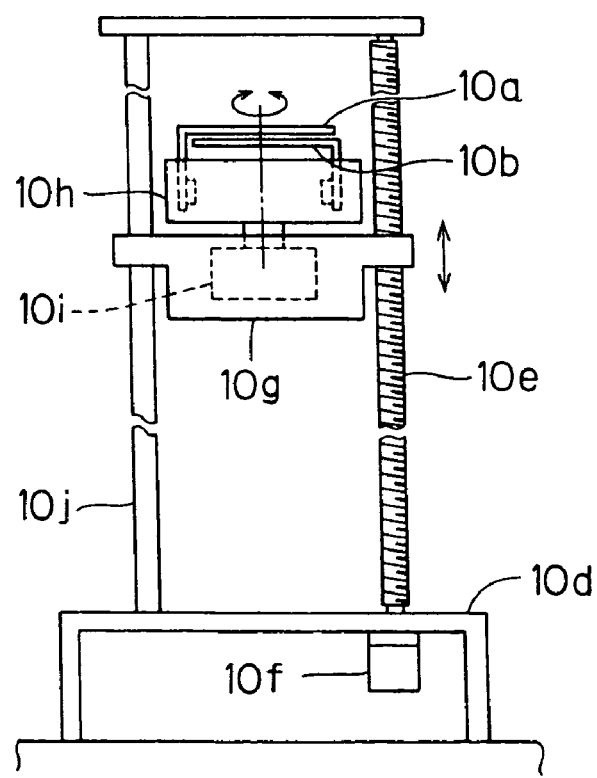

FIGS. 6A and 6B are views for illustrating the transport robot 10A. FIG. 6A is a plan view of the transport robot 10A, and FIG. 6B is a front view of the transport robot 10A. The transport robot 10A includes a pair of (upper and lower) holding arms 10*a* and 10*b* in proximity to each other for holding a substrate W in a substantially horizontal position. Each of the holding arms 10*a* and 10*b* includes a distal end portion of a substantially C-shaped plan configuration, and a plurality of pins 10*c* projecting inwardly from the inside of the substantially C-shaped distal end portion for supporting the peripheral edge of a substrate W from below.

The transport robot 10A further includes a base 10*d* fixedly mounted on an apparatus base (or an apparatus frame). A guide shaft 10*j* is mounted upright on the base 10*d*, and a threaded shaft 10*e* is rotatably mounted and supported upright on the base 10*d*. A motor 10*f* for rotatably driving the threaded shaft 10*e* is fixedly mounted to the base 10*d*. A lift 10*g* is in threaded engagement with the threaded shaft 10*e*, and is freely slidable relative to the guide shaft 10*j*. With such an arrangement, the motor 10*f* rotatably drives the threaded shaft 10*e*, whereby the lift 10*g* is guided by the guide shaft 10*j* to move up and down in a vertical direction (in the Z direction).

An arm base 10*h* is mounted on the lift 10*g* pivotably about a vertical axis. The lift 10*g* contains a motor 10*i* for pivotably driving the arm base 10*h*. The pair of (upper and lower) holding arms 10*a* and 10*b* described above are provided on the arm base 10*h*. Each of the holding arms 10*a* and 10*b* is independently movable back and forth in a horizontal direction (in the direction of the pivot radius of the arm base 10*h*) by a sliding drive mechanism (not shown) mounted to the arm base 10*h*.

With such an arrangement, the transport robot 10A can cause each of the pair of holding arms 10*a* and 10*b* to independently gain access to the substrate rest parts PASS1, PASS2, the thermal processing units provided in the thermal processing towers 9, the coating processing units provided in the bottom coating processor 8, and the substrate rest parts PASS3, PASS4 to be described later, thereby transferring and receiving substrates W to and from the above-mentioned parts and units, as shown in FIG. 6A.

Next, the resist coating block 3 will be described. The resist coating block 3 is provided so as to be sandwiched between the BARC block 2 and the development processing block 4. A partition 13 for closing off the communication of atmosphere is also provided between the resist coating block 3 and the BARC block 2. The partition 13 is provided with the pair of vertically arranged substrate rest parts PASS3 and PASS4 each for the transfer of a substrate W between the BARC block 2 and the resist coating block 3. The substrate rest parts PASS3 and PASS4 are similar in construction to the above-mentioned substrate rest parts PASS1 and PASS2.

The upper substrate rest part PASS3 is used for the transport of a substrate W from the BARC block 2 to the resist coating block 3. Specifically, a transport robot 10B of the resist coating block 3 receives the substrate W placed on the substrate rest part PASS3 by the transport robot 10A of the BARC block 2. The lower substrate rest part PASS4, on the other hand, is used for the transport of a substrate W from the resist coating block 3 to the BARC block 2. Specifically, the transport robot 10A of the BARC block 2 receives the substrate W placed on the substrate rest part PASS4 by the transport robot 10B of the resist coating block 3.

The substrate rest parts PASS3 and PASS4 extend through the partition 13. Each of the substrate rest parts PASS3 and PASS4 includes an optical sensor (not shown) for detecting the presence or absence of a substrate W thereon. Based on a detection signal from each of the sensors, a judgment is made as to whether or not the transport robots 10A and 10B stand ready to transfer and receive a substrate W to and from the substrate rest parts PASS3 and PASS4. A pair of (upper and lower) cool plates WCP of a water-cooled type for roughly cooling a substrate W are provided under the substrate rest parts PASS3 and PASS4 to extend through the partition 13.

The resist coating block 3 is a processing block for forming the photoresist film by coating on a substrate W coated with the anti-reflection film by the BARC block 2. In this preferred embodiment, a chemically amplified resist is used as the photoresist. The resist coating block 3 comprises a resist coating processor 15 for forming the photoresist film by coating on the anti-reflection film serving as the undercoating film, a pair of thermal processing towers 16 for performing a thermal process which accompanies the resist coating process, and the transport robot 10B for transferring and receiving a substrate W to and from the resist coating processor 15 and the pair of thermal processing towers 16.

In the resist coating block 3, the resist coating processor 15 and the pair of thermal processing towers 16 are arranged on opposite sides of the transport robot 10B. Specifically, the resist coating processor 15 is on the front side of the substrate processing apparatus, and the pair of thermal processing towers 16 are on the rear side thereof. Additionally, a thermal barrier not shown is provided on the front side of the pair of thermal processing towers 16. Thus, the thermal effect of the pair of thermal processing towers 16 upon the resist coating processor 15 is avoided by spacing the resist coating processor 15 apart from the pair of thermal processing towers 16 and by providing isolation therebetween using the thermal barrier.

As shown in FIG. 2, the resist coating processor 15 includes three coating processing units 15a to 15c similar in construction to each other and arranged in stacked relation in bottom-to-top order. Each of the coating processing units 15a to 15c includes a spin chuck 17 for rotating a substrate W in a substantially horizontal plane while holding the substrate W in a substantially horizontal position under suction, a coating nozzle 18 for applying the photoresist onto the substrate W held on the spin chuck 17, and a cup (not shown) surrounding the substrate W held on the spin chuck 17.

As shown in FIG. 3, one of the thermal processing towers 16 which is closer to the indexer block 1 includes six heating parts PHP1 to PHP6 arranged in stacked relation in bottom-to-top order for heating a substrate W up to a predetermined temperature. The other of the thermal processing towers 16 which is farther from the indexer block 1 includes the cooling processing units CP4 to CP9 arranged in stacked relation in bottom-to-top order for setting and maintaining a substrate W at a predetermined temperature close to room temperature. Heater controllers CONT for controlling the temperatures of the thermal processing units including the heating parts PHP1 to PHP6 and the cooling processing unit CP4 to CP9 are provided on the lowermost ends of the respective thermal processing towers 16.

Figure 7A:
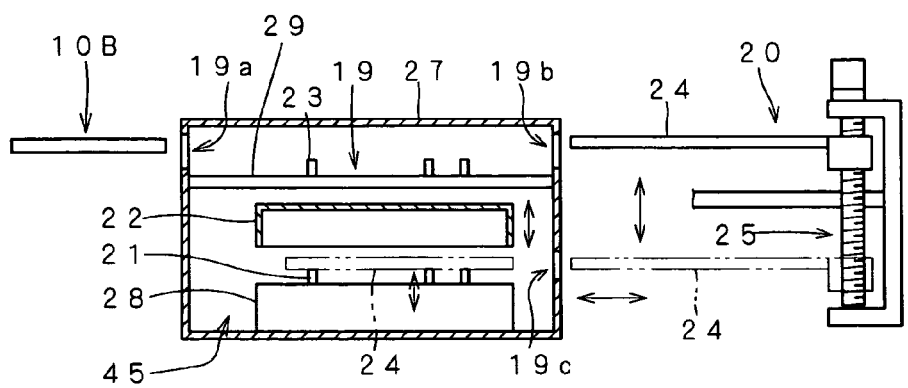
FIGS. 7A and 7B show a construction of a heating part according to the preferred embodiment of the present invention.
Figure 7B:
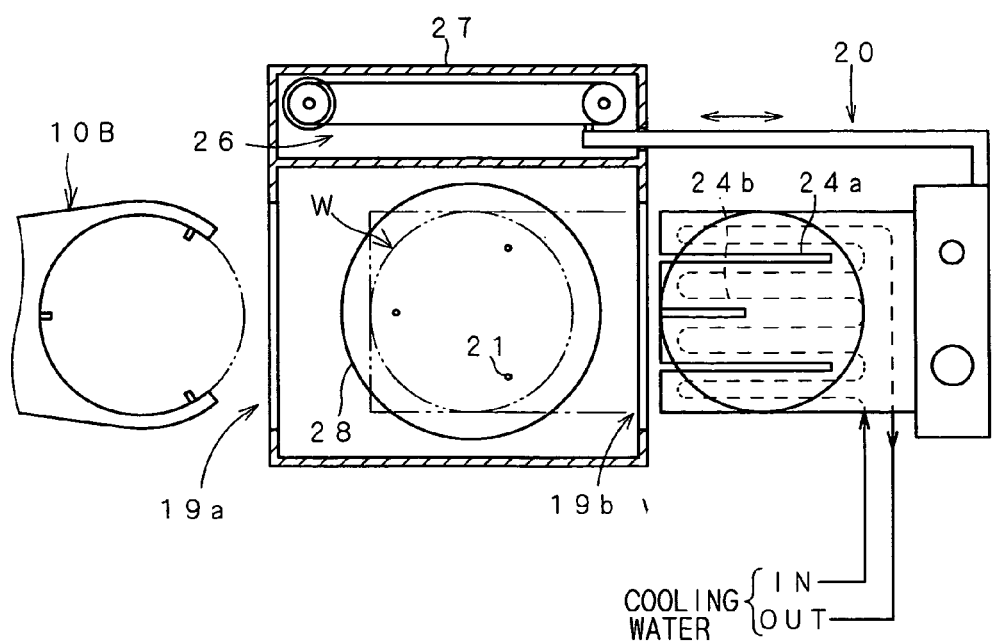

FIGS. 7A and 7B are views showing a structure of each of the heating parts PHP1 to PHP6. FIG. 7A is a side view, and FIG. 7B is a plan view. For purposes of illustration, only a top cover 22 and an enclosure 27 are shown in cross section in FIGS. 7A and 7B, and a temporary substrate rest part 19 and a partition 29 are not shown in FIG. 7B.

As shown in FIGS. 7A and 7B, each of the heating parts PHP1 to PHP6 includes the enclosure 27. The interior space of the enclosure 27 is divided by the partition 29 into an upper space and a lower space. The upper space is used as the temporary substrate rest part 19 in which a substrate W is placed, and the lower space is used as a heating chamber 45 for performing a heating process on a substrate W. Each of the heating parts PHP1 to PHP6 further includes a local transport mechanism 20 for transporting a substrate W between the heating chamber 45 and the temporary substrate rest part 19.

Alternatively, the lower space may be used as the temporary substrate rest part 19, and the upper space be used as the heating chamber 45.

A hot plate 28 for performing the heating process on the substrate W placed thereon is provided in the heating chamber 45. The hot plate 28 is provided with a plurality of movable support pins 21 extendable out of and retractable into the plate surface. The vertically movable top cover 22 for covering a substrate W during the heating process is provided over the hot plate 28. In the temporary substrate rest part 19, a plurality of fixed support pins 23 for supporting a substrate W is provided on the partition 29.

The local transport mechanism 20 includes a plate-like holding arm 24 for holding a substrate W in a substantially horizontal position. The holding arm 24 is moved vertically by a screw feed drive mechanism 25, and is moved back and forth by a belt drive mechanism 26. The holding arm 24 is provided with a plurality of slits 24a so as not to interfere with the movable support pins 21 and the fixed support pins 23 when the holding arm 24 moves to over the hot plate 28 and the temporary substrate rest part 19.

The holding arm 24 has a cooling function. As illustrated in FIG. 7B, a cooling water passage 24b is provided inside the holding arm 24. Passing a cooling water through the cooling water passage 24b allows the cooling of the substrate W held by the holding arm 24.

The local transport mechanism 20 is provided on the opposite side of the heating chamber 45 and the temporary substrate rest part 19 from the transport robot 10B, that is, on the rear side of the substrate processing apparatus. In an upper portion of the enclosure 27, an opening 19a for allowing the transport robot 10B to enter the temporary substrate rest part 19 is provided on the front side of the substrate processing apparatus, and an opening 19b for allowing the local transport mechanism 20 to enter the temporary substrate rest part 19 is provided on the rear side of the substrate processing apparatus. In a lower portion of the enclosure 27, no openings are provided on the front side of the substrate processing apparatus, but an opening 19c for allowing the local transport mechanism 20 to enter the heating chamber 45 is provided on the rear side of the substrate processing apparatus.

A substrate W is carried into and out of each of the above-mentioned heating parts PHP1 to PHP6 in a manner to be described below. First, the transport robot 10B holds a substrate W, and places the substrate W onto the fixed support pins 23 of the temporary substrate rest part 19. Subsequently, the holding arm 24 of the local transport mechanism 20 moves to under the substrate W, and then moves slightly upwardly to receive the substrate W from the fixed support pins 23. The holding arm 24 which holds the substrate W moves backwardly out of the enclosure 27, and moves downwardly to a position opposed to the hot plate 28. At this time, the movable support pins 21 of the hot plate 28 are in a lowered heating position in which the lower surface of the substrate W can contact the upper surface of the holding arm 24, and the top cover 22 is in a raised position. The holding arm 24 which holds the substrate W moves to over the hot plate 28. After the movable support pins 21 move upwardly and receive the substrate W in a receiving position, the holding arm 24 moves backwardly out of the enclosure 27. Subsequently, the movable support pins 21 move downwardly to place the substrate W onto the hot plate 28, and the top cover 22 moves downwardly to cover the substrate W. In this state, the substrate W is subjected to the heating process.

After the heating process, the top cover 22 moves upwardly, and the movable support pins 21 move upwardly to lift the substrate W. Next, after the holding arm 24 moves to under the substrate W, the movable support pins 21 move downwardly to transfer the substrate W to the holding arm 24. The holding arm 24 which holds the substrate W moves backwardly out of the enclosure 27, and then moves upwardly to transport the substrate W to the temporary substrate rest part 19. The substrate W supported by the holding arm 24 within the temporary substrate rest part 19 is roughly cooled by the holding arm 24. Then, the holding arm 24 places the cooled substrate W onto the fixed support pins 23 of the temporary substrate rest part 19. Thereafter, the transport robot 10B takes out the substrate W, and transports the substrate W to a processing unit of the following stage.

As discussed above, the transport robot 10B transfers and receives the substrate W to and from only the temporary substrate rest part 19 at room temperature in each of the heating parts PHP1 to PHP6, but does not transfer and receive the substrate W to and from the hot plate 28. This avoids the temperature rise of the transport robot 10B. The provision of the opening 19c only on the side of the local transport mechanism 20 in the lower portion of the enclosure 27 prevents the heat atmosphere leaking out through the opening 19c from affecting the transport robot 10B and the resist coating processor 15. The transport robot 10B transfers and receives a substrate W directly to and from the cooling processing units CP4 to CP9.

The heating processing units HP1 to HP6 of the BARC block 2 described above and heating processing units HP7 to HP11 to be described later have a construction similar to the interior construction of the heating chamber 45 of the heating parts PHP1 to PHP6. Specifically, each of the heating processing units HP1 to HP11 includes a hot plate 28, a plurality of movable support pins 21 and a top cover 22. For the heating process in each of the heating processing units HP1 to HP11, the movable support pins 21 which support a substrate W move downwardly to place the substrate W onto the hot plate 28, and the top cover 22 moves downwardly to cover the substrate W. Then, after the heating process, the top cover 22 moves upwardly, and the movable support pins 21 move upwardly to lift the substrate W so that the substrate W is spaced apart from the hot plate 28.

The transport robot 10B is precisely identical in construction with the transport robot 10A. Thus, the transport robot 10B can cause each of a pair of holding arms 10a and 10b thereof to independently gain access to the substrate rest parts PASS3, PASS4, the thermal processing units provided in the thermal processing towers 16, the coating processing units provided in the resist coating processor 15, and the substrate rest parts PASS5, PASS6 to be described later, thereby transferring and receiving substrates W to and from the above-mentioned parts and units.

Next, the development processing block 4 will be described. The development processing block 4 is provided so as to be sandwiched between the resist coating block 3 and the interface block 5. A partition 13 for closing off the communication of atmosphere is also provided between the resist coating block 3 and the development processing block 4. The partition 13 is provided with the pair of vertically arranged substrate rest parts PASS5 and PASS6 each for the transfer of a substrate W between the resist coating block 3 and the development processing block 4. The substrate rest parts PASS5 and PASS6 are similar in construction to the above-mentioned substrate rest parts PASS1 and PASS2.

The upper substrate rest part PASS5 is used for the transport of a substrate W from the resist coating block 3 to the development processing block 4. Specifically, a transport robot 10C of the development processing block 4 receives the substrate W placed on the substrate rest part PASS5 by the transport robot 10B of the resist coating block 3. The lower substrate rest part PASS6, on the other hand, is used for the transport of a substrate W from the development processing block 4 to the resist coating block 3. Specifically, the transport robot 10B of the resist coating block 3 receives the substrate W placed on the substrate rest part PASS6 by the transport robot 10C of the development processing block 4.

The substrate rest parts PASS5 and PASS6 extend through the partition 13. Each of the substrate rest parts PASS5 and PASS6 includes an optical sensor (not shown) for detecting the presence or absence of a substrate W thereon. Based on a detection signal from each of the sensors, a judgment is made as to whether or not the transport robots 10B and 10C stand ready to transfer and receive a substrate W to and from the substrate rest parts PASS5 and PASS6. A pair of (upper and lower) cool plates WCP of a water-cooled type for roughly cooling a substrate W are provided under the substrate rest parts PASS5 and PASS6 to extend through the partition 13.

The development processing block 4 is a processing block for performing a development process on an exposed substrate W. The development processing block 4 comprises a development processor 30 for applying a developing solution to a substrate exposed in a pattern to perform the development process, a pair of thermal processing towers 31a, 31b for performing a thermal process which accompanies the development process, and the transport robot 10C for transferring and receiving a substrate W to and from the development processor 30 and the pair of thermal processing towers 31a, 31b. The transport robot 10C is precisely identical in construction to the above-mentioned transport robots 10A and 10B.

As shown in FIG. 2, the development processor 30 includes five development processing units 30a to 30e similar in construction to each other and arranged in stacked relation in bottom-to-top order. Each of the development processing units 30a to 30e includes a spin chuck 32 for rotating a substrate W in a substantially horizontal plane while holding the substrate W in a substantially horizontal position under suction, a nozzle 33 for applying the developing solution onto the substrate W held on the spin chuck 32, and a cup (not shown) surrounding the substrate W held on the spin chuck 32.

As shown in FIG. 3, the thermal processing tower 31a which is closer to the indexer block 1 includes the five heating processing units HP7 to HP11 for heating a substrate W up to a predetermined temperature, and the cooling processing units CP10 to CP12 for setting and maintaining a substrate W at a predetermined temperature close to room temperature. The cooling processing units CP10 to CP12 and the heating processing units HP7 to HP11 are arranged in stacked relation in bottom-to-top order in this thermal processing tower 31a. The thermal processing tower 31b which is farther from the indexer block 1, on the other hand, includes six heating parts PHP7 to PHP12 and the cooling processing unit CP13 which are arranged in stacked relation. Like the above-mentioned heating parts PHP1 to PHP6, each of the heating parts PHP7 to PHP12 is a thermal processing unit including a temporary substrate rest part 19, a heating chamber 45, and a local transport mechanism 20. In an upper portion of the enclosure 27 of each of the heating parts PHP7 to PHP12, openings are provided on the side of the local transport mechanism 20 and on the side of a transport robot 10D of the interface block 5, but no openings are provided on the side of the transport robot 10C of the development processing block 4. In other words, the transport robot 10D of the interface block 5 can gain access to the heating parts PHP7 to PHP12, but the transport robot 10C of the development processing block 4 cannot gain access thereto. The transport robot 10C of the development processing block 4 gains access to the thermal processing units incorporated in the thermal processing tower 31a.

The pair of vertically arranged substrate rest parts PASS7 and PASS8 in proximity to each other for the transfer of a substrate W between the development processing block 4 and the interface block 5 adjacent thereto are incorporated in the thermal processing tower 31b. The upper substrate rest part PASS7 is used for the transport of a substrate W from the development processing block 4 to the interface block 5. Specifically, the transport robot 10D of the interface block 5 receives the substrate W placed on the substrate rest part PASS7 by the transport robot 10C of the development processing block 4. The lower substrate rest part PASS8, on the other hand, is used for the transport of a substrate W from the interface block 5 to the development processing block 4. Specifically, the transport robot 10C of the development processing block 4 receives the substrate W placed on the substrate rest part PASS8 by the transport robot 10D of the interface block 5. Each of the substrate rest parts PASS7 and PASS8 includes openings both on the side of the transport robot 10C of the development processing block 4 and on the side of the transport robot 10D of the interface block 5.

Heater controllers CONT for controlling the temperatures of the thermal processing units are provided on the lowermost ends of the respective thermal processing towers 31a and 31b.

Next, the interface block 5 will be described. The interface block 5 is a block provided adjacent to the development processing block 4 for transferring and receiving substrates W to and from the exposure apparatus STP which is an external apparatus separate from the substrate processing apparatus according to the present invention. The interface block 5 in this preferred embodiment comprises a transport mechanism 35 for transferring and receiving a substrate W to and from the exposure apparatus STP, a pair of edge exposure parts EEW for exposing the periphery of a substrate W formed with the photoresist film, and the transport robot 10D for transferring and receiving a substrate W to and from the heating parts PHP7 to PHP12 provided in the development processing block 4 and the edge exposure parts EEW.

As shown in FIG. 2, each of the edge exposure parts EEW includes a spin chuck 36 for rotating a substrate W in a substantially horizontal plane while holding the substrate W in a substantially horizontal position under suction, and a light irradiator 37 for exposing the periphery of the substrate W held on the spin chuck 36 to light. The pair of edge exposure parts EEW are arranged in vertically stacked relation in the center of the interface block 5. The transport robot 10D provided adjacent to the edge exposure parts EEW and the thermal processing tower 31b of the development processing block 4 is similar in construction to the above-mentioned transport robots 10A to 10C.

As illustrated also in FIG. 2, a return buffer RBF for the return of substrates W is provided under the pair of edge exposure parts EEW, and the pair of vertically arranged substrate rest parts PASS9 and PASS10 are provided under the return buffer RBF. The return buffer RBF is provided to temporarily store a substrate W subjected to a post-exposure heating process in the heating parts PHP7 to PHP12 of the development processing block 4 if the development processing block 4 is unable to perform the development process on the substrate W because of some sort of malfunction and the like. The return buffer RBF includes a cabinet capable of storing a plurality of substrates W in tiers. The upper substrate rest part PASS9 is used for the transfer of a substrate W from the transport robot 10D to the transport mechanism 35. The lower substrate rest part PASS10 is used for the transfer of a substrate W from the transport mechanism 35 to the transport robot 10D. The transport robot 10D gains access to the return buffer RBF.

The transport mechanism 35 includes a movable base 35a movable horizontally in the Y direction, and a holding arm 35b mounted on the movable base 35a and for holding a substrate W, as illustrated in FIG. 2. The holding arm 35b is capable of moving vertically, pivoting and moving back and forth in the direction of the pivot radius relative to the movable base 35a. With such an arrangement, the transport mechanism 35 transfers and receives a substrate W to and from the exposure apparatus STP, transfers and receives a substrate W to and from the substrate rest parts PASS9 and PASS10, and stores and takes a substrate W into and out of a send buffer SBF for the sending of substrates W. The send buffer SBF is provided to temporarily store a substrate W prior to the exposure process if the exposure apparatus STP is unable to accept the substrate W, and includes a cabinet capable of storing a plurality of substrates W in tiers.

A downflow of clean air is always supplied into the indexer block 1, the BARC block 2, the resist coating block 3, the development processing block 4, and the interface block 5 described above to thereby avoid the adverse effects of raised particles and gas flows upon the processes in the respective blocks 1 to 5. Additionally, a slightly positive pressure relative to the external environment of the substrate processing apparatus is maintained in each of the blocks 1 to 5 to prevent the entry of particles and contaminants from the external environment into the blocks 1 to 5.

The above-mentioned indexer block 1, BARC block 2, resist coating block 3, development processing block 4 and interface block 5 are units into which the substrate processing apparatus of this preferred embodiment is divided in mechanical terms. The blocks 1 to 5 are assembled to individual block frames, respectively, which are in turn connected together to construct the substrate processing apparatus.

On the other hand, this preferred embodiment employs another type of units for transport control regarding the transport of substrates, aside from the blocks which are units based on the above-mentioned mechanical division. The units for transport control regarding the transport of substrates are referred to herein as "cells." Each of the cells comprises a target location to which a substrate is transported, and a transport robot functioning as a transport element for transporting a substrate to the target location. The target locations in this preferred embodiment include, for example, the various processing units (the thermal processing units, the coating processing units and the development processing units), the substrate rest parts PASS1 to PASS10 for merely placing a substrate W thereon, the table 6, the return buffer RBF, the send buffer SBF, and the like.

Each of the substrate rest parts PASS1 to PASS10 functions as an entrance substrate rest part for the receipt of a substrate W into a cell or as an exit substrate rest part for the transfer of a substrate W out of a cell. The transfer of substrates W between the cells is carried out through the substrate rest parts. The "transport robot" used herein as a constituent of the cells shall include the substrate transfer mechanism 7 and the transport mechanism 35.

The substrate processing apparatus in this preferred embodiment comprises six cells: an indexer cell, a BARC cell, a resist coating cell, a development processing cell, a post-exposure bake cell, and an interface cell. The indexer cell includes the table 6 and the substrate transfer mechanism 7, and is consequently similar in construction to the indexer block 1 which is one of the units based on the mechanical division. The BARC cell includes the bottom coating processor 8, the pair of thermal processing towers 9 and the transport robot 10A. The BARC cell is also consequently similar in construction to the BARC block 2 which is one of the units based on the mechanical division. The resist coating cell includes the resist coating processor 15, the pair of thermal processing towers 16, and the transport robot 10B. The resist coating cell is also consequently similar in construction to the resist coating block 3 which is one of the units based on the mechanical division.

The substrate rest parts PASS1 and PASS2, which function as the entrance or exit substrate rest parts for the indexer cell and the BARC cell, are included in both of the indexer cell and the BARC cell, as will be understood from the discussion about the operation of the substrate processing apparatus of this preferred embodiment to be described later. The substrate rest parts PASS3 and PASS4, which function as the entrance or exit substrate rest parts for the BARC cell and the resist coating cell, are included in both of the BARC cell and the resist coating cell.

The development processing cell includes the development processor 30, the thermal processing tower 31a and the transport robot 10C. Because the transport robot 10C cannot gain access to the heating parts PHP7 to PHP12 of the thermal processing tower 31b as discussed above, the development processing cell does not include the thermal processing tower 31b. In this respect, the development processing cell differs from the development processing block 4 which is one of the units based on the mechanical division.

The post-exposure bake cell includes the thermal processing tower 31b (except the substrate rest parts PASS7 and PASS8) positioned in the development processing block 4, the edge exposure parts EEW positioned in the interface block 5, the return buffer RBF positioned in the interface block 5, and the transport robot 10D positioned in the interface block 5. That is, the post-exposure bake cell spans the development processing block 4 and the interface block 5 which are units based on the mechanical division. In this manner, constituting one cell including the heating parts PHP7 to PHP12 for performing the post-exposure heating process and the transport robot 10D allows the rapid transport of exposed substrates W into the heating parts PHP7 to PHP12 for the execution of the thermal process. Such an arrangement is preferred for the use of a chemically amplified resist which is required to be subjected to a heating process as soon as possible after the exposure of a substrate W in a pattern.

The substrate rest parts PASS7 and PASS8 included in the thermal processing tower 31b are provided for the transfer of a substrate W between the transport robot 10C of the development processing cell and the transport robot 10D of the post-exposure bake cell.

The interface cell includes the send buffer SBF, and the transport mechanism 35 for transferring and receiving a substrate W to and from the exposure apparatus STP which is an external apparatus. The interface cell differs from the interface block 5 which is one of the units based on the mechanical division in not including the transport robot 10D, the edge exposure parts EEW, and the like. The substrate rest parts PASS9 and PASS10 under the edge exposure parts EEW are provided for the transfer of a substrate W between the transport robot 10D of the post-exposure bake cell and the transport mechanism 35 of the interface cell. Each of the above-mentioned cells includes a slave controller SC to be described later.

The substrate rest parts PASS5 and PASS6, which function as the entrance or exit substrate rest parts for the resist coating cell and the development processing cell, are included in both of the resist coating cell and the development processing cell. The substrate rest parts PASS7 and PASS8, which function as the entrance or exit substrate rest parts for the development processing cell and the post-exposure bake cell, are included in both of the development processing cell and the post-exposure bake cell. The substrate rest parts PASS9 and PASS10, which function as the entrance or exit substrate rest parts for the post-exposure bake cell and the interface cell, are included in both of the post-exposure bake cell and the interface cell.

Figure 8:
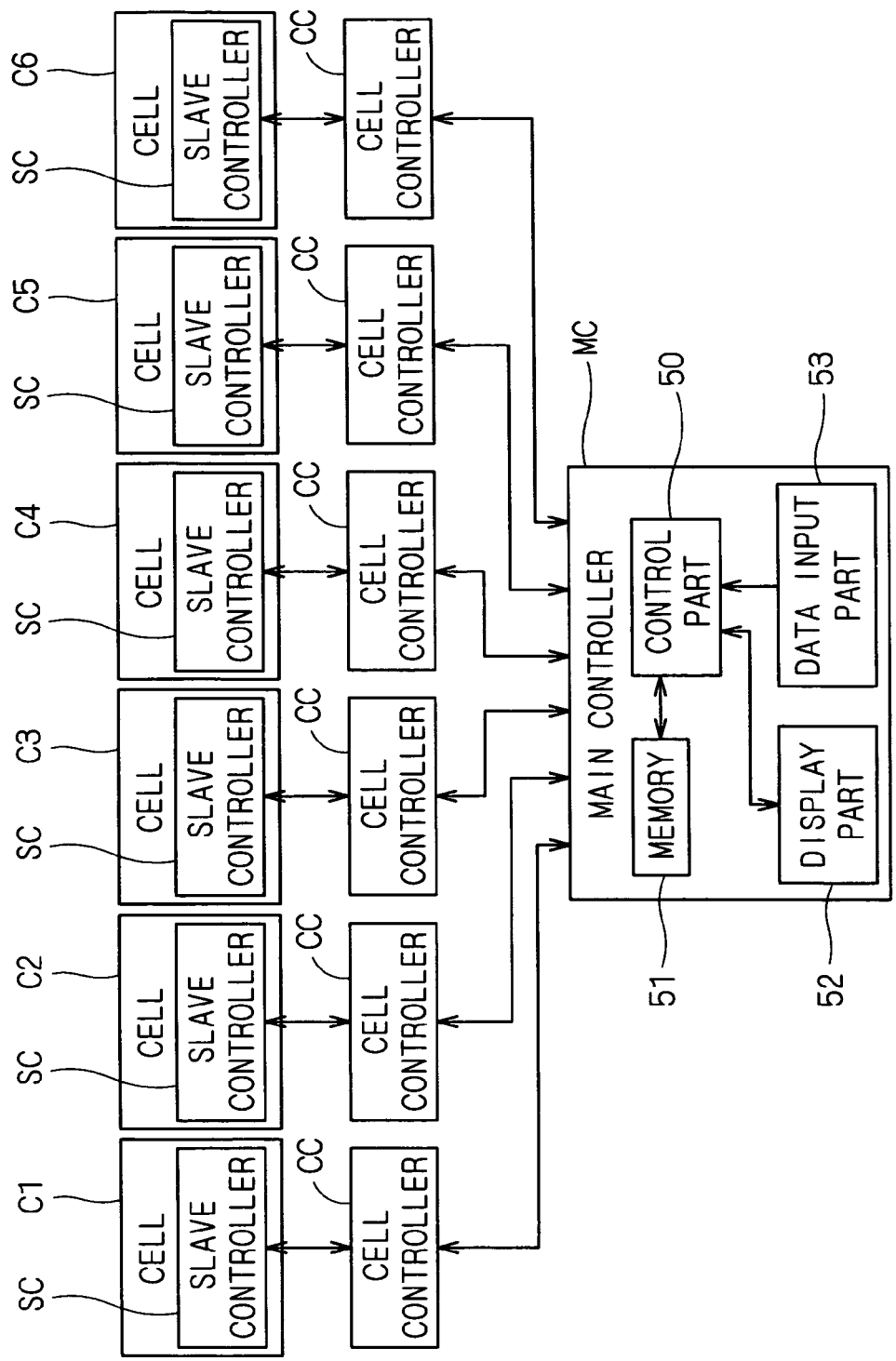
FIG. 8 is a block diagram schematically showing a control mechanism in the substrate processing apparatus according to the preferred embodiment of the present invention.

A control mechanism in the substrate processing apparatus of this preferred embodiment will be described. FIG. 8 is a schematic block diagram of the control mechanism. As shown in FIG. 8, the substrate processing apparatus of this preferred embodiment has a three-level control hierarchy composed of a main controller MC, cell controllers CC individually provided in corresponding relation to the respective cells, and the slave controllers SC individually provided in the respective cells. Cells C1 to C6 shown in FIG. 8 denote the indexer cell, the BARC cell, the resist coating cell, the development processing cell, the post-exposure bake cell and the interface cell, respectively.

The single main controller MC at the first level is provided for the entire substrate processing apparatus, and is principally responsible for controlling the operation of the entire substrate processing apparatus and the operation of the cell controllers CC. The main controller MC comprises a memory 51 for storing various pieces of data, a display part 52 for displaying various pieces of information on a screen, a data input part 53 for accepting operator's data entry, and a control part 50 for controlling the operations of the memory 51, the display part 52 and the data input part 53, and for carrying out communications with the cell controllers CC.

The control part 50 includes a CPU for performing various computation processes. The data input part 53 includes, for example, a keyboard. The operator manipulates the keyboard to input data to the control part 50. The memory 51 stores therein a processing unit recipe, a flow recipe and the like which are created by the operator manipulating the data input part 53, and also stores therein an operating program and the like. The "processing unit recipe" refers to a collection of processing conditions in each of the processing units. An example of the processing unit recipe for one of the heating processing units includes a collection of heating temperature, heating time and the like. The "flow recipe" refers to a collection of substrate transport sequences, i.e. process flows, by means of the transport robots in the substrate processing apparatus. The flow recipe is individually prepared for each lot when a plurality of lots different in transport sequence from each other are used for the transport of substrates.

Each of the cell controllers CC at the second level is principally responsible for controlling the transport of substrates and the operation of the processing units in a corresponding cell. Specifically, the cell controller CC for each cell sends and receives information in such a manner that a first cell controller CC for a first cell sends information indicating that a substrate W is placed on a predetermined substrate rest part to a second cell controller CC for a second cell adjacent to the first cell, and the second cell controller CC for the second cell having received the substrate W sends information indicating that the substrate W is received from the predetermined substrate rest part back to the first cell controller CC. Such sending and receipt of information are carried out through the main controller MC. Upon receipt of the information indicating that a substrate W is transported into a corresponding cell, each cell controller CC controls a corresponding transport robot in accordance with the flow recipe received from the main controller MC to transport the substrate W in the corresponding cell.

Each of the slave controllers SC at the third level directly controls the processing units provided in a corresponding cell under the direction of a corresponding cell controller CC, based on the flow recipe and processing unit recipe received from the main controller MC. Specifically, each of the slave controllers SC controls plate temperatures and the like when controlling the thermal processing units (the heating processing units, the cooling processing units, the heating parts, and the like), and controls the number of revolutions of a substrate W, the discharge timing of a processing solution and the like when controlling the coating processing units and the development processing units.

Thus, this preferred embodiment lightens the control load on each of the controllers by the use of the three-level control hierarchy. Each of the cell controllers CC manages a substrate transport schedule within a corresponding cell without consideration of transport schedules within its adjacent cells. This lightens the transport control load on each of the cell controllers CC to consequently improve the throughput of the substrate processing apparatus.

The cell controllers CC and the slave controllers SC are similar in hardware construction to typical computers. Specifically, each of the cell and slave controllers CC and SC comprises a CPU for performing various computation processes, a memory for storing an operating program and data therein, and the like. The main controller MC, the cell controllers CC and the slave controllers SC are assembled together with the above-mentioned blocks to the apparatus frame.

The operation of the substrate processing apparatus of this preferred embodiment will be described. First, brief description will be given on an example of the process flow of substrates W in the substrate processing apparatus when all of the processing blocks are used. In this example, an adhesion promotion process is not performed on the substrates W in the BARC cell.

In the indexer cell (or the indexer block 1), when no substrate W is placed on the upper substrate rest part PASS1, the substrate transfer mechanism 7 takes an unprocessed substrate W out of a predetermined cassette C, and places the unprocessed substrate W onto the substrate rest part PASS1. Then, when a processed substrate W is placed on the lower substrate rest part PASS2, the substrate transfer mechanism 7 receives the processed substrate W, and stores the processed substrate W into the predetermined cassette C.

When the upper substrate rest part PASS1 is emptied of the unprocessed substrate W, the substrate transfer mechanism 7 takes another unprocessed substrate W out of the predetermined cassette C, and places the unprocessed substrate W onto the substrate rest part PASS1. Then, when another processed substrate W is placed on the substrate rest part PASS2, the substrate transfer mechanism 7 receives the processed substrate W, and stores the processed substrate W into the predetermined cassette C. Thereafter, a similar operation is repeated.

Thus, regardless of the substrate transport status in other cells, the substrate transfer mechanism 7 of the indexer cell takes a substrate W out of a cassette C and places the substrate W onto the substrate rest part PASS1 when no substrate W is placed on the substrate rest part PASS1, and takes a substrate W from the substrate rest part PASS2 and stores the substrate W into a cassette C when the substrate W is placed on the substrate rest part PASS2.

When an unprocessed substrate W is placed on the substrate rest part PASS1, the transport robot 10A of the BARC cell uses the holding arm 10b to receive the unprocessed substrate W. Because the holding arm 10b holds a processed substrate W at this time, the transport robot 10A places the processed substrate W onto the lower substrate rest part PASS2 before the transport robot 10A receives the unprocessed substrate W placed on the substrate rest part PASS1. At this time, the holding arm 10a holds no substrate W.

After receiving the unprocessed substrate W, the transport robot 10A transports the unprocessed substrate W to one of the cooling processing units CP1 to CP3. Because a previously processed substrate W occupies the destination cooling processing unit at this time, the transport robot 10A receives the previously processed substrate W by using the empty holding arm 10a, and thereafter carries the unprocessed substrate W held on the holding arm 10b into the destination cooling processing unit. The substrate W carried into one of the cooling processing units CP1 to CP3 is set at a predetermined temperature close to room temperature, and maintained at the predetermined temperature with great precision until the transport robot 10A comes to the same cooling processing unit next time.

The transport robot 10A transports the processed substrate W held on the holding arm 10a to one of the coating processing units 8a to 8c. Because a substrate W previously subjected to the coating process using the anti-reflection coating solution occupies the destination coating processing unit at this time, the transport robot 10A receives the previously coated substrate W by using the empty holding arm 10b, and thereafter carries the substrate W held on the holding arm 10a into the destination coating processing unit. The substrate W carried into one of the coating processing units 8a to 8c is spin-coated with the anti-reflection coating solution by the time that the transport robot 10A comes to the same coating processing unit next time.

The transport robot 10A transports the substrate W subjected to the coating process and held on the holding arm 10b to one of the heating processing units HP1 to HP6. Because a substrate W previously subjected to the heating process occupies the destination heating processing unit at this time, the transport robot 10A receives the previously heated substrate W by using the empty holding arm 10a, and thereafter carries the substrate W held on the holding arm 10b into the destination heating processing unit. The substrate W carried into one of the heating processing units HP1 to HP6 is subjected to the heating process by the time that the transport robot 10A comes to the same heating processing unit next time. Heating the substrate W in one of the heating processing units dries the coating solution to form the anti-reflection film serving as an undercoat on the substrate W.

The transport robot 10A transports the substrate W subjected to the heating process and held on the holding arm 10a to one of the pair of cool plates WCP of the water-cooled type provided under the substrate rest parts PASS3 and PASS4. Because a substrate W previously being cooled is placed on the destination cool plate WCP at this time, the transport robot 10A receives the substrate W previously being cooled by using the empty holding arm 10b, and thereafter places the substrate W held on the holding arm 10a onto the destination cool plate WCP. The substrate W placed on one of the cool plates WCP is cooled until the transport robot 10A comes to the same cool plate WCP next time.

The transport robot 10A places the cooled substrate W held on the holding arm 10b onto the substrate rest part PASS3. When a substrate W subjected to the development process and sent from the development processing cell through the resist coating cell is placed on the lower substrate rest part PASS4, the transport robot 10A uses the emptied holding arm 10b to receive the substrate W subjected to the development process.

After receiving the substrate W subjected to the development process, the transport robot 10A moves toward the substrate rest parts PASS1 and PASS2, and places the substrate W subjected to the development process onto the substrate rest part PASS2. When no substrate W is placed on the substrate rest part PASS4, the transport robot 10A returns to the substrate rest parts PASS1 and PASS2 while holding no substrate W. Then, the transport robot 10A receives a next unprocessed substrate W placed on the substrate rest part PASS1 by the use of the holding arm 10b, and transports the unprocessed substrate W to one of the cooling processing units CP1 to CP3. Thereafter, a similar operation is repeated.

As described above, the transport robot 10A transports substrates W to the plurality of target locations including the processing units and the substrate rest parts while following the sequence from the first target location to the last target location, and then to the first target location again, and thereafter repeats a similar operation. In this manner, the transport robot 10A performs such circulating transport between the plurality of target locations. In the above-mentioned example, when no substrate W is placed on the substrate rest part PASS4, the transport robot 10A transports a substrate W first to the cooling processing unit, then to the coating processing unit, the heating processing unit and the cool plate WCP in the order named, and finally to the substrate rest part PASS3. Then, the transport robot 10A transports a substrate W to the first target location, i.e., the cooling processing unit again, and thereafter repeats a similar operation.

In the resist coating cell, when a substrate W formed with the anti-reflection film is placed on the substrate rest part PASS3, the transport robot 10B uses the holding arm 10b to receive the substrate W. Because the holding arm 10b holds a processed substrate W at this time, the transport robot 10B places the processed substrate W onto the lower substrate rest part PASS4 before the transport robot 10B receives the substrate W placed on the substrate rest part PASS3. At this time, the holding arm 10a holds no substrate W.

After receiving the substrate W formed with the anti-reflection film, the transport robot 10B transports the substrate W to one of the cooling processing units CP4 to CP9. Because a previously processed substrate W occupies the destination cooling processing unit at this time, the transport robot 10B receives the previously processed substrate W by using the empty holding arm 10a, and thereafter carries the substrate W held on the holding arm 10b into the destination cooling processing unit. The substrate W carried into one of the cooling processing units CP4 to CP9 is set at a predetermined temperature close to room temperature, and maintained at the predetermined temperature with great precision until the transport robot 10B comes to the same cooling processing unit next time.

The transport robot 10B transports the substrate W subjected to the temperature maintenance process and held on the holding arm 10a to one of the coating processing units 15a to 15c. Because a substrate W previously subjected to the resist coating process occupies the destination coating processing unit at this time, the transport robot 10B receives the previously coated substrate W by using the empty holding arm 10b, and thereafter carries the substrate W held on the holding arm 10a into the destination coating processing unit. The substrate W carried into one of the coating processing units 15a to 15c is spin-coated with the resist by the time that the transport robot 10B comes to the same coating processing unit next time.

Since the temperature of substrates W transported to the coating processing units 15a to 15c has been maintained with great precision at the predetermined temperature by the cooling processing units CP4 to CP9, there are small variations in substrate temperature between the substrates W in the coating processing units 15a to 15c. This increases coating performance in the resist coating process which requires precise substrate temperature control.

The transport robot 10B transports the substrate W subjected to the resist coating process and held on the holding arm 10b to one of the heating parts PHP1 to PHP6. Because a substrate W previously subjected to the heating process occupies the temporary substrate rest part 19 of the destination heating part at this time, the transport robot 10B receives the previously heated substrate W by using the empty holding arm 10a, and thereafter carries the substrate W held on the holding arm 10b into the temporary substrate rest part of the destination heating part. The substrate W carried into one of the heating parts PHP1 to PHP6 is subjected to the heating process by the time that the transport robot 10B comes to the same heating part next time. Heating the substrate W in one of the heating parts PHP1 to PHP6 removes a solvent component from the photoresist to form a photoresist film on the substrate W. The substrate W taken out of one of the heating parts PHP1 to PHP6 is roughly cooled by the holding arm 24 having the cooling function.

The transport robot 10B transports the substrate W subjected to the heating process and held on the holding arm 10a to a different one of the cooling processing units CP4 to CP9 from the cooling processing unit used in the preceding cooling process. Because a previously processed substrate W occupies the destination cooling processing unit at this time, the transport robot 10B receives the previously processed substrate W by using the empty holding arm 10b, and thereafter carries the substrate W held on the holding arm 10a into the destination cooling processing unit. The substrate W carried into the cooling processing unit is cooled down to a predetermined temperature close to room temperature, and maintained at the predetermined temperature with great precision until the transport robot 10B comes to the same cooling processing unit next time.

The transport robot 10B places the cooled substrate W held on the holding arm 10b onto the substrate rest part PASS5. When a substrate W subjected to the development process is placed on the lower substrate rest part PASS6, the transport robot 10B uses the emptied holding arm 10b to receive the substrate W subjected to the development process.

After receiving the substrate W subjected to the development process, the transport robot 10B moves toward the substrate rest parts PASS3 and PASS4, and places the substrate W subjected to the development process onto the substrate rest part PASS4. When no substrate W is placed on the substrate rest part PASS6, the transport robot 10B returns to the substrate rest parts PASS3 and PASS4 while holding no substrate W. Then, the transport robot 10B receives a next substrate W formed with the anti-reflection film and placed on the substrate rest part PASS3 by the use of the holding arm 10b, and transports the substrate W to one of the cooling processing units CP4 to CP9. Thereafter, a similar operation is repeated.

Like the transport robot 10A of the BARC cell, the transport robot 10B performs the circulating transport between the plurality of target locations, as described above. In the above-mentioned example, when no substrate W is placed on the substrate rest part PASS6, the transport robot 10B transports a substrate W first to the cooling processing unit, then to the resist coating processing unit, the heating part and the cooling processing unit in the order named, and finally to the substrate rest part PASS5. Then, the transport robot 10B transports a substrate W to the first target location, i.e., the cooling processing unit again, and thereafter repeats a similar operation.

In the development processing cell, when a substrate W formed with the photoresist film is placed on the substrate rest part PASS5, the transport robot 10C uses the holding arm 10*b* to receive the substrate W. Because the holding arm 10*b* holds a processed substrate W at this time, the transport robot 10C places the processed substrate W onto the lower substrate rest part PASS6 before the transport robot 10C receives the substrate W placed on the substrate rest part PASS5. At this time, the holding arm 10*a* holds no substrate W.

After receiving the substrate W formed with the photoresist film, the transport robot 10C places the substrate W onto the substrate rest part PASS7 without processing the substrate W. When a substrate W subjected to the post-exposure heating process is placed on the lower substrate rest part PASS8, the transport robot 10C uses the emptied holding arm 10*b* to receive the substrate W subjected to the post-exposure heating process.

After receiving the substrate W subjected to the post-exposure heating process, the transport robot 10C transports the substrate W to one of the cooling processing units CP10 to CP12. Because a previously processed substrate W occupies the destination cooling processing unit at this time, the transport robot 10C receives the previously processed substrate W by using the empty holding arm 10*a*, and thereafter carries the substrate W held on the holding arm 10*b* into the destination cooling processing unit. The substrate W carried into one of the cooling processing units CP10 to CP12 is set at a predetermined temperature close to room temperature, and maintained at the predetermined temperature with great precision until the transport robot 10C comes to the same cooling processing unit next time.

The transport robot 10C transports the substrate W subjected to the temperature maintenance process and held on the holding arm 10*a* to one of the development processing units 30*a* to 30*e*. Because a substrate W previously subjected to the development process occupies the destination development processing unit at this time, the transport robot 10C receives the previously developed substrate W by using the empty holding arm 10*b*, and thereafter carries the substrate W held on the holding arm 10*a* into the destination development processing unit. The substrate W carried into one of the development processing units 30*a* to 30*e* is subjected to the development process by the time that the transport robot 10C comes to the same development processing unit next time.

The transport robot 10C transports the substrate W subjected to the development process and held on the holding arm 10*b* to one of the heating processing units HP7 to HP11. Because a substrate W previously subjected to the heating process occupies the destination heating processing unit at this time, the transport robot 10C receives the previously heated substrate W by using the empty holding arm 10*a*, and thereafter carries the substrate W held on the holding arm 10*b* into the destination heating processing unit. The substrate W carried into one of the heating processing units HP7 to HP11 is subjected to the heating process by the time that the transport robot 10C comes to the same heating processing unit next time.

The transport robot 10C transports the substrate W subjected to the heating process and held on the holding arm 10*a* to one of the pair of cool plates WCP of the water-cooled type provided under the substrate rest parts PASS5 and PASS6. Because a substrate W previously being cooled is placed on the destination cool plate WCP at this time, the transport robot 10C receives the substrate W previously being cooled by using the empty holding arm 10*b*, and thereafter places the substrate W held on the holding arm 10*a* onto the destination cool plate WCP. The substrate W placed on one of the cool plates WCP is cooled until the transport robot 10C comes to the same cool plate WCP next time.

After receiving the cooled substrate W, the transport robot 10C places the cooled substrate W onto the substrate rest part PASS6. When a next substrate W formed with the photoresist film is placed on the substrate rest part PASS5, the transport robot 10C receives the substrate W by the use of the holding arm 10*b*, transports the substrate W to the substrate rest part PASS7, and places the substrate W onto the substrate rest part PASS7. When no substrate W is placed on the substrate rest part PASS5, the transport robot 10C returns to the substrate rest parts PASS7 and PASS8 while holding no substrate W. Then, the transport robot 10C receives a next substrate W from the substrate rest part PASS8, and transports the substrate W to one of the cooling processing units CP10 to CP12. Thereafter, a similar operation is repeated.

Like the transport robots 10A and 10B, the transport robot 10C performs the circulating transport between the plurality of target locations, as described above. In the above-mentioned example, when no substrate W is placed on the substrate rest part PASS5, the transport robot 10C transports a substrate W first to the cooling processing unit, then to the development processing unit, the heating processing unit and the cool plate WCP in the order named, and finally to the substrate rest part PASS6. Then, the transport robot 10C transports a substrate W to the first target location, i.e., the cooling processing unit again, and thereafter repeats a similar operation.

In the post-exposure bake cell, when a substrate W formed with the photoresist film is placed on the substrate rest part PASS7, the transport robot 10D uses the holding arm 10*b* to receive the substrate W. Because the holding arm 10*b* holds a substrate W subjected to the post-exposure heating process at this time, the transport robot 10D places the substrate W subjected to the post-exposure heating process onto the lower substrate rest part PASS8 before the transport robot 10D receives the substrate W placed on the substrate rest part PASS7. At this time, the holding arm 10*a* holds no substrate W.

After receiving the substrate W formed with the photoresist film, the transport robot 10D transports the substrate W to one of the edge exposure parts EEW. Because a previously processed substrate W occupies the destination edge exposure part EEW at this time, the transport robot 10D receives the previously processed substrate W by using the empty holding arm 10*a*, and thereafter carries the substrate W held on the holding arm 10*b* into the destination edge exposure part EEW. A peripheral edge portion of the substrate W carried into one of the edge exposure parts EEW is exposed to light by the time that the transport robot 10D comes to the same edge exposure part EEW next time.

The transport robot 10D places the substrate W subjected to the edge exposure process and held on the holding arm 10*a* onto the substrate rest part PASS9. When a substrate W exposed to light by the exposure apparatus STP is placed on the lower substrate rest part PASS10, the transport robot 10D uses the emptied holding arm 10*a* to receive the exposed substrate W.

The transport robot 10D transports the substrate W subjected to the edge exposure process and held on the holding arm 10*a* to one of the heating parts PHP7 to PHP12. Because a substrate W previously subjected to the heating process occupies the destination heating part at this time, the transport robot 10D receives the previously heated substrate W by using the empty holding arm 10b, and thereafter carries the substrate W held on the holding arm 10a into the destination heating part. The substrate W carried into one of the heating parts PHP7 to PHP12 is subjected to a post-exposure bake process to be described below by the time that the transport robot 10D comes to the same heating part next time. The post-exposure bake process is performed to uniformly diffuse in the photoresist film a product generated in a photochemical reaction during the exposure process. The substrate W taken out of one of the heating parts PHP7 to PHP12 is roughly cooled by the holding arm 24 having the cooling function.

After receiving the substrate W subjected to the post-exposure bake process, the transport robot 10D moves toward the substrate rest parts PASS7 and PASS8, and places the substrate W subjected to the post-exposure bake process onto the substrate rest part PASS8. When no substrate W is placed on the substrate rest part PASS10, the transport robot 10D bypasses the heating parts PHP7 to PHP12 and returns to the substrate rest parts PASS7 and PASS8. Then, the transport robot 10D receives a next substrate W formed with the photoresist film and placed on the substrate rest part PASS7 by the use of the holding arm 10b, and transports the substrate W to one of the edge exposure parts EEW. Thereafter, a similar operation is repeated.

Like the transport robots 10A to 10C, the transport robot 10D performs the circulating transport between the plurality of target locations, as described above. In the above-mentioned example, when no substrate W is placed on the substrate rest part PASS10, the transport robot 10D transports a substrate W first to the edge exposure part EEW and finally to the substrate rest part PASS9. Then, the transport robot 10D transports a substrate W to the first target location, i.e., the edge exposure part EEW again, and thereafter repeats a similar operation.

In the interface cell, when a substrate W subjected to the edge exposure process is placed on the substrate rest part PASS9, the transport mechanism 35 receives the substrate W, and carries the substrate W into the exposure apparatus STP external to the substrate processing apparatus. The substrate W carried into the exposure apparatus STP is subjected to the pattern exposure process. The transport mechanism 35 also receives an exposed substrate W from the exposure apparatus STP, and places the exposed substrate W onto the substrate rest part PASS10. Then, the transport mechanism 35 receives a next substrate W subjected to the edge exposure process from the substrate rest part PASS9, and repeats a similar operation.

Like the transport robots 10A to 10D, the transport mechanism 35 performs the circulating transport between the plurality of target locations, when the exposure apparatus STP external to the substrate processing apparatus is regarded as one of the target locations. In the above-mentioned example, the transport mechanism 35 transports a substrate W first to the exposure apparatus STP and finally to the substrate rest part PASS10. Then, the transport mechanism 35 transports a substrate W to the first target location, i.e., the exposure apparatus STP again, and thereafter repeats a similar operation.

As described above, each of the substrates W taken in succession out of a cassette C is transported to the plurality of target locations to which the substrates W are transported, such as the substrate rest parts and the processing units, in sequence. The substrates W transported to a target location are carried in succession out of the target location by the transport robot. Each of the processing units replaces each of the substrates W transported thereto with another to perform a predetermined process on each of the substrates W. Each substrate W subjected to a series of processes is returned to the indexer cell, and is stored into the cassette C again.

In the substrate processing apparatus of this preferred embodiment, each of the cell controllers CC controls a corresponding transport robot, based on the flow recipe, to effect the transport of substrates W to the target locations in a corresponding cell. After receiving a substrate W, each of the processing units performs a predetermined process under the control of a corresponding slave controller SC.

Further, mutually independent substrate transport control is effected in each of the cells in this preferred embodiment. For this reason, each of the cell controllers CC has no information about the substrate transport status in the cells controlled by other cell controllers CC. The addition of a new cell to the substrate processing apparatus of this preferred embodiment exerts no influence upon the transport of substrates W in other cells. Therefore, the substrate processing apparatus of this preferred embodiment is excellent in feature expandability.

For the circulating transport of the transport robot in each cell, one transport cycle is completed when the transport robot, which receives a substrate W in a substrate receiving position, i.e., in an entrance substrate rest part and then transports substrates to the respective target locations, returns to the substrate receiving position again. In the BARC cell, as an example, one transport cycle is completed when the transport robot 10A starting from the substrate rest part PASS1 returns to the substrate rest part PASS1 again.

Next, the flex flow in the substrate processing apparatus of this preferred embodiment will be described with reference to FIG. 9. FIG. 9 shows an example of the transport cycles in the flex flow according to this preferred embodiment. A transport sequence assumed herein is such that a substrate W transferred from the indexer cell is directly transported to the resist coating cell without being processed in the BARC cell, and the substrate W processed in the resist coating cell is not transported to its subsequent cells such as the development processing cell but returns to the indexer cell.

Each substrate A1 to A6 belonging to a preceding lot A is circulatingly transported by the transport robot 10B in a transport sequence such that each substrate A1 to A6 is carried out of the substrate rest part PASS3, transported to the heating part PHP1, the cooling processing unit CP4 and the coating processing unit 15a for the resist in the order named, and placed on the substrate rest part PASS4, whereby a series of processes are performed on each substrate A1 to A6. Each substrate B1 to B4 belonging to a succeeding lot B, which succeeds the preceding lot A, follows a transport sequence such that each substrate B1 to B4 is carried out of the substrate rest part PASS3, transported to the heating part PHP1, and placed on the substrate rest part PASS4, whereby the heating process is performed on each substrate B1 to B4.

The cell controller CC for controlling the resist coating cell (referred to hereinafter as a "cell controller RCC") controls the operation of the transport robot 10B, based on a flow recipe for the lot A and a flow recipe for the lot B both received from the main controller MC, to achieve the transport of the substrates belonging to the lots A and B in the resist coating cell.

As shown in FIG. 9, after the transport robot 10A of the BARC cell takes the substrate A5 belonging to the preceding lot A from the substrate rest part PASS1 and places the substrate A5 onto the substrate rest part PASS3, the second transport cycle (denoted as "2" in the "Transport Cycle" column of FIG. 9) in the resist coating cell starts, and the transport robot 10B receives the substrate A5 from the substrate rest part PASS3 and transports the substrate A5 to the heating part PHP1. Because the substrate A4 occupies the temporary substrate rest part 19 of the heating part PHP1 at this time, the transport robot 10B takes the substrate A4 out of the temporary substrate rest part 19 of the heating part PHP1, and thereafter carries the substrate A5 into the heating part PHP1.

After the transport robot 10A of the BARC cell takes the substrate A5 from the substrate rest part PASS1, the substrate transfer mechanism 7 of the indexer cell takes a next substrate W, that is, the last substrate A6 belonging to the preceding lot A out of a cassette C, and places the substrate A6 onto the substrate rest part PASS1. Then, the transport robot 10A of the BARC cell takes the substrate A6 from the substrate rest part PASS1, and places the substrate A6 onto the substrate rest part PASS3.

The transport robot 10B transports the substrate A4 taken out of the heating part PHP1 to the cooling processing unit CP4, and changes places between the substrate A3 present in the cooling processing unit CP4 and the substrates A4 transported by the transport robot 10B. Next, the transport robot 10B transports the substrate A3 taken out of the cooling processing unit CP4 to the coating processing unit 15a, and changes places between the substrate A2 present in the coating processing unit 15a and the substrate A3 transported by the transport robot 10B. Then, the transport robot 10B returns to the substrate rest parts PASS3 and PASS4 while holding the substrate A2 taken out of the coating processing unit 15a, and places the substrate A2 onto the substrate rest part PASS4. This completes the second transport cycle in the resist coating cell.

The transport robot 10A of the BARC cell receives the substrate A2 placed on the substrate rest part PASS4, and places the substrate A2 onto the substrate rest part PASS2. The substrate transfer mechanism 7 of the indexer cell receives the substrate A2 subjected to a series of processes from the substrate rest part PASS2, and stores the substrate A2 into the cassette C.

After the transport robot 10A of the BARC cell takes the substrate A6 from the substrate rest part PASS1 and places the substrate A6 onto the substrate rest part PASS3, the third transport cycle (denoted as "3" in the "Transport Cycle" column of FIG. 9) in the resist coating cell starts, and the transport robot 10B receives the substrate A6 from the substrate rest part PASS3 and transports the substrate A6 to the heating part PHP1. Then, the transport robot 10B changes places between the substrate A6 and the substrate A5 present in the heating part PHP1.

After the substrate A6 is taken from the substrate rest part PASS1, the substrate transfer mechanism 7 of the indexer cell takes a next substrate W, that is, the first substrate B1 belonging to the succeeding lot B out of the cassette C, and places the substrate B1 onto the substrate rest part PASS1. Then, the transport robot 10A of the BARC cell takes the substrate B1 from the substrate rest part PASS1, and places the substrate B1 onto the substrate rest part PASS3.

The transport robot 10B transports the substrate A5 taken out of the heating part PHP1 to the cooling processing unit CP4, and changes places between the substrate A5 and the substrate A4 present in the cooling processing unit CP4. Next, the transport robot 10B transports the substrate A4 taken out of the cooling processing unit CP4 to the coating processing unit 15a, and changes places between the substrate A4 and the substrate A3 present in the coating processing unit 15a. Then, the transport robot 10B places the substrate A3 taken out of the coating processing unit 15a onto the substrate rest part PASS4. This completes the third transport cycle.

The substrate A3 placed on the substrate rest part PASS4 is transported through the BARC cell to the indexer cell. The indexer cell stores the received processed substrate A3 into the cassette C.

After the transport robot 10A of the BARC cell takes the substrate B1 from the substrate rest part PASS1 and places the substrate B1 onto the substrate rest part PASS3, the cell controller RCC virtually executes therein the next transport cycle, i.e., the fourth transport cycle (denoted as "4" in the "Transport Cycle" column) for the transport of the substrate belonging to the succeeding lot B, as shown in FIG. 10, based on the flow recipes for the respective lots A and B, prior to taking the substrate B1 from the substrate rest part PASS3. In the virtual fourth transport cycle, the cell controller RCC judges whether or not interference occurs between the transport of the substrate B1 and the transport of the substrates belonging to the preceding lot A. With reference to FIG. 10, no interference occurs between the transport of the substrate B1 and the transport of the substrates belonging to the preceding lot A in the virtual fourth transport cycle because the substrate B1 is transported to the heating part PHP1 and no substrates belonging to the lot A are transported to the heating part PHP1.

Prior to the transport of the substrate belonging to the succeeding lot B, the cell controller RCC thus virtually executes the next transport cycle to make the predictive judgment as to whether or not interference occurs between the transport of the substrate belonging to the succeeding lot B and the transport of the substrates belonging to the preceding lot A in the new transport cycle, based on the flow recipes which are information representing the transport sequences for the lots A and B. Because no interference occurs between the transport of the substrate B1 and the transport of the substrates belonging to the preceding lot A in the virtual fourth transport cycle as discussed above, the cell controller RCC controls the operation of the transport robot 10B to actually execute the fourth transport cycle having been virtually executed, as shown in FIG. 9. When the fourth transport cycle starts, the transport robot 10B takes the substrate B1 from the substrate rest part PASS3, transports the substrate B1 to the heating part PHP1, and changes places between the substrate B1 and the substrate A6 present in the heating parts PHP1.

After the substrate B1 is taken from the substrate rest part PASS1, the substrate transfer mechanism 7 of the indexer cell takes the next substrate B2 out of the cassette C, and places the substrate B2 onto the substrate rest part PASS1. Then, the transport robot 10A of the BARC cell takes the substrate B2 from the substrate rest part PASS1, and places the substrate B2 onto the substrate rest part PASS3.

The transport robot 10B transports the substrate A6 taken out of the heating part PHP1 to the cooling processing unit CP4, and changes places between the substrate A6 and the substrate A5 present in the cooling processing unit CP4. Next, the transport robot 10B transports the substrate A5 taken out of the cooling processing unit CP4 to the coating processing unit 15a, and changes places between the substrate A5 and the substrate A4 present in the coating processing unit 15a. Then, the transport robot 10B places the substrate A4 taken out of the coating processing unit 15a onto the substrate rest part PASS4. This completes the fourth transport cycle. Thereafter, the substrate A4 placed on the substrate rest part PASS4 is stored into the cassette C.

After the transport robot 10A of the BARC cell takes the substrate B2 from the substrate rest part PASS1 and places the substrate B2 onto the substrate rest part PASS3, the cell controller RCC virtually executes therein the next transport cycle, i.e., the fifth transport cycle (denoted as "5" in the "Transport Cycle" column) for the transport of the substrate belonging to the succeeding lot B, as shown in FIG. 11, prior to taking the substrate B2 from the substrate rest part PASS3. In the virtual fifth transport cycle, the cell controller RCC judges whether or not interference occurs between the transport of the substrates belonging to the succeeding lot B and the transport of the substrates belonging to the preceding lot A. With reference to FIG. 11, the interference occurs between the transport of the substrates belonging to the preceding lot A and the transport of the substrates belonging to the succeeding lot B in the virtual fifth transport cycle because the substrate A5 and the substrate B1 are transported to the substrate rest part PASS4.

If the cell controller RCC judges that the interference occurs between the transport of the substrates belonging to the preceding lot A and the transport of the substrates belonging to the succeeding lot B in this manner as a result of the virtual execution of the next transport cycle, the cell controller RCC controls the operation of the transport robot 10B during the actual execution of the next transport cycle to skip the process of transporting the substrate belonging to the succeeding lot B which occupies a processing unit and which will cause the interference when transported out of the processing unit.

In this example, the cell controller RCC does not execute the virtual fifth transport cycle shown in FIG. 11 but controls the operation of the transport robot 10B so as not to transport the substrate B1 which becomes a cause of the interference out of the heating part PHP1 during the actual execution of the next or fifth transport cycle. Thus, the substrate B1 remains in the heating part PHP1. Specifically, in the actual fifth transport cycle, the transport robot 10B neither receives the substrate B2 from the substrate rest part PASS3 nor transports the substrate B1 present in the heating part PHP1 to the cooling processing unit CP4, but takes the substrate A6 out of the cooling processing unit CP4 and transports the substrate A6 to the coating processing unit 15a. Then, the transport robot 10B changes places between the substrate A6 and the substrate A5 present in the coating processing unit 15a, and places the substrate A5 taken out of the coating processing unit 15a onto the substrate rest part PASS4. Thereafter, the substrate A5 placed on the substrate rest part PASS4 is stored into the cassette C.

The heating process of the substrate B1 in the heating part PHP1 is completed in the fourth transport cycle. The roughly cooled substrate B1 is placed on the temporary substrate rest part 19 in the actual fifth transport cycle.

After the transport robot 10B places the substrate A5 onto the substrate rest part PASS4, the cell controller RCC virtually executes again the next transport cycle, i.e., the sixth transport cycle (denoted as "6" in the "Transport Cycle" column), as shown in FIG. 12. With reference to FIG. 12, the interference occurs between the transport of the substrates belonging to the preceding lot A and the transport of the substrates belonging to the succeeding lot B in the virtual sixth transport cycle because the substrate A6 and the substrate B1 are transported to the substrate rest part PASS4. Therefore, the cell controller RCC controls the operation of the transport robot 10B so that the substrate B1 is not transported out of the heating part PHP1 but remains in the heating part PHP1 during the actual execution of the next or sixth transport cycle, as shown in FIG. 9. Specifically, in the actual sixth transport cycle, the transport robot 10B neither receives the substrate B2 from the substrate rest part PASS3 nor transports the substrate B1, but moves to the coating processing unit 15a and takes the substrate A6 out of the coating processing unit 15a. Then, the transport robot 10B places the substrate A6 taken out of the coating processing unit 15a onto the substrate rest part PASS4. Thereafter, the substrate A6 placed on the substrate rest part PASS4 is stored into the cassette C.

After the transport robot 10B places the substrate A6 onto the substrate rest part PASS4, the cell controller RCC virtually executes again the next transport cycle, i.e., the seventh transport cycle (denoted as "7" in the "Transport Cycle" column), as shown in FIG. 13. With reference to FIG. 13, no interference occurs between the transport of the substrates belonging to the preceding lot A and the transport of the substrates belonging to the succeeding lot B in the virtual seventh transport cycle because the substrates B1 and B2 are transported to the substrate rest part PASS4 and the heating part PHP1, respectively, and no substrates belonging to the lot A are transported to the substrate rest part PASS4 and the heating part PHP1. Therefore, the cell controller RCC actually executes the virtual seventh transport cycle shown in FIG. 13.

In the actual seventh transport cycle, the transport robot 10B takes the substrate B2 from the substrate rest part PASS3, and transports the substrate B2 to the heating part PHP1. Then, the transport robot 10B changes places between the substrate B2 and the substrate B1 present in the heating part PHP1, and places the substrate B1 onto the substrate rest part PASS4. Thereafter, the substrate B1 placed on the substrate rest part PASS4 is stored into the cassette C. After the substrate B2 is taken from the substrate rest part PASS1, the substrate transfer mechanism 7 of the indexer cell takes the next substrate B3 out of the cassette C, and places the substrate B3 onto the substrate rest part PASS1. The transport robot 10A of the BARC cell takes the substrate B3 from the substrate rest part PASS1, and places the substrate B3 onto the substrate rest part PASS3.

After the transport of the first substrate B1 belonging to the succeeding lot B to the last target location, the cell controller RCC causes the substrates belonging to the succeeding lot B to be transported in succession without executing the virtual transport cycle. In this example, because the substrate B1 is placed on the substrate rest part PASS4 which is the last target location in the seventh transport cycle, the next transport cycle, i.e., the eighth transport cycle (denoted as "8" in the "Transport Cycle" column) is immediately executed. In the eighth transport cycle, the transport robot 10B takes the substrate B3 from the substrate rest part PASS3, transports the substrate B3 to the heating part PHP1, and changes places between the substrate B3 and the substrate B2 present in the heating part PHP1. Then, the transport robot 10B places the substrate B2 onto the substrate rest part PASS4. Thereafter, a similar operation is repeated.

The processes are performed only in the resist coating cell in the above-mentioned example. However, if the processes are performed in the BARC cell, the development processing cell or the post-exposure bake cell, the cell controller CC for controlling each cell performs a similar operation to be described below. Specifically, regardless of the substrate transport status in the cells controlled by other cell controllers CC, if the cell controller CC for controlling each cell predictively judges that interference occurs between the transport of the substrates belonging to the preceding lot and the transport of the substrates belonging to the succeeding lot in the next transport cycle, the cell controller CC controls the operation of the corresponding transport robot to skip the process of transporting the substrate belonging to the succeeding lot which will cause this interference when transported out of a processing unit during the actual execution of the next transport cycle. When a substrate W remains in the heating processing units or the cooling processing units because the process of transporting the substrate W is skipped, the movable support pins are in their raised position so that the substrate W is spaced apart from the plate.

In the substrate processing apparatus according to this preferred embodiment as described above, each of the cell controllers CC makes a predictive judgment as to whether or not interference occurs between the transport of substrates belonging to the succeeding lot and the transport of substrates belonging to the preceding lot in a new transport cycle. If each cell controller CC judges that the interference occurs, the process of transporting a substrate belonging to the succeeding lot which will cause the interference when transported out of a processing unit is skipped during the actual execution of the next transport cycle. In other words, if a prediction is made that the transport of the substrates belonging to the succeeding lot will interfere with the transport of the substrates belonging to the preceding lot in the new transport cycle, the substrate belonging to the succeeding lot which will cause the interference is not transported out of the processing unit but is caused to remain in the processing unit in the new transport cycle. Thus, only judging whether or not the transport of the substrates belonging to the succeeding lot interferes with the transport of the substrates belonging to the preceding lot in the next transport cycle is required to allow the transport of the substrates belonging to the succeeding lot as in the flex flow of this preferred embodiment. This simplifies the transport control in the substrate processing apparatus, as compared with the method of controlling the transport of substrates in consideration of not only the next transport cycle but also the transport cycles required until all of the transport of the substrates belonging to the succeeding lot is completed. Consequently, the present invention reduces the malfunctions of the substrate processing apparatus to improve the reliability thereof.

The entrance substrate rest part on which a substrate W to be transported to a target location by the transport robot is placed and the exit substrate rest part on which a substrate W subjected to a process in a processing unit is placed are individually provided in the substrate processing apparatus of this preferred embodiment. This allows a processed substrate W to be placed on the exit substrate rest part if a substrate W remains in a processing unit and a substrate W on the entrance substrate rest part is not taken out by the transport robot. This insures the transfer of the processed substrate W to another processing part if a substrate W remains in the processing unit.

Each of the heating parts PHP1 to PHP12 of this preferred embodiment, which comprises the holding arm 24 having the cooling function, can immediately cool a substrate W heated by the hot plate 28. Thus, if a substrate W remains in each heating part without being transported therefrom, the substrate W is prevented from being left uncooled after being heated. This improves the quality of the heating process which requires precise management of heating time, such as the heating process immediately after the resist coating process and the heating process immediately after the exposure process.

The cooling process in the BARC cell and the development processing cell is not generally required to be performed as immediately after the heating process as in the resist coating cell and the post-exposure bake cell. However, if a user demands higher quality, the heating processing units in each cell may be replaced with the heating parts.

The above-mentioned example shows that, in the step of actually transporting the substrate belonging to the succeeding lot B, the next transport cycle is virtually executed and the details of the actual transport cycle for the lot B are determined. Instead, the substrates belonging to the lots A and B may be transported based on a previously created transport process chart or schedule presenting a list of details of all transport cycles for the lots A and B prior to the start of the transport of the substrates belonging to the preceding lot A. This transport process chart contains the details of transport cycles present between a transport cycle in which the transport of the first substrate A1 starts and a transport cycle in which the transport of the substrate A3 starts (which immediately precedes the first transport cycle of FIG. 9), and the details of transport cycles present between a transport cycle in which the transport of the last substrate B4 belonging to the succeeding lot B starts (which immediately follows the eighth transport cycle of FIG. 9) and a transport cycle in which the transport of the substrate B4 ends, for example, in addition to the chart shown in FIG. 9. Such a transport process chart is created by the cell controller RCC in advance.

An example of a method of creating the transport process chart is as follows. First, the cell controller RCC creates part of the transport process chart containing the third transport cycle of FIG. 9 and its previous transport cycles, based on the flow recipe for the lot A. Then, the cell controller RCC virtually executes the next transport cycle therein based on the flow recipes for the lots A and B as described above to make the predictive judgment as to whether or not the interference occurs between the transport of the substrates belonging to the lot B and the transport of the substrates belonging to the lot A. The cell controller RCC determines the details of the actual transport cycles based on the result of the judgment, and creates the remainder of the transport process chart containing the fourth transport cycle and its subsequent transport cycles. Thereafter, the cell controller RCC effects the transport of the substrates belonging to the lots A and B, based on the completed transport process chart.

In such a case, the cell controller RCC can create the transport process chart in consideration of only the next transport cycle for the substrates belonging to the succeeding lot B. When the control of the transport of the substrates is considered to start in the step of creating the transport process chart, the control of the transport in the substrate processing apparatus is simplified. The transport process chart is prepared for each cell because each cell controller does not recognize the substrate transport status in the cells controlled by other cell controllers CC as discussed above.

The construction of the substrate processing apparatus according to the present invention is not limited to the configuration shown in FIGS. 1 to 4, but various modifications may be made therein if substrates W are transported by a transport robot to a processing part for performing a predetermined process on the substrates W.

While the invention has been described in detail, the foregoing description is in all aspects illustrative and not restrictive. It is understood that numerous other modifications and variations can be devised without departing from the scope of the invention.

What is claimed is:

1. A substrate processing apparatus comprising:
   a plurality of locations to which substrates are transported;
   a transport element configured for circulatingly transporting preceding substrates and succeeding substrates successively between said plurality of locations, said preceding substrates belonging to a preceding lot determined to follow a first transport sequence, said succeeding substrates belonging to a succeeding lot determined to follow a second transport sequence different from said first transport sequence, said preceding lot being immediately followed by said succeeding lot; and an operation control element configured for controlling the operation of said transport element, wherein said plurality of locations include one or more processing units each being configured for performing a predetermined process on a substrate, and wherein said operation control element includes a judging element configured for making a predictive judgment as to whether or not interference occurs between the transport of said succeeding substrates and the transport of said preceding substrates in a new transport cycle, based on information representing said first and second transport sequences, an objective substrate determining element configured for determining an objective substrate, said objective substrate being one of said succeeding substrates occupying one of said one or more processing units and causing said interference when transported out of said one of said one or more processing units after being processed in said one of said one or more processing units, if said interference is predicted, and a transport cycle correcting element configured for executing said new transport cycle while causing said objective substrate to remain in said one of said one or more processing units.

2. The substrate processing apparatus according to claim 1, further comprising a repeating element configured for activating said judging element each time a transport cycle is updated.

3. The substrate processing apparatus according to claim 2, wherein after a leading substrate belonging to said succeeding lot reaches the last one of said plurality of locations, said operation control element causes other substrates belonging to said succeeding lot to be transported in succession.

4. The substrate processing apparatus according to claim 1, further comprising a first substrate rest part, wherein said plurality of locations include a second substrate rest part, and wherein said transport element is configured to transports a substrate placed on said first substrate rest part to said plurality of locations, and places a substrate processed in said one or more processing units onto said second substrate rest part.

5. The substrate processing apparatus according to claim 1, wherein said one or more processing units include a heating part, said heating part including a heating element for performing a heating process on a substrate transported thereto, and a holding arm configured for holding the substrate heated by said heating element and to perform a cooling process on the substrate.

6. The substrate processing apparatus according to claim 4, wherein said one or more processing units include a heating part, said heating part including a heating element for performing a heating process on a substrate transported thereto, and a holding arm configured for holding the substrate heated by said heating element and to perform a cooling process on the substrate.

7. An apparatus for determining a transport plan for substrates in a substrate processing apparatus, comprising:

an element configured for acquiring a transport plan about the transport of preceding substrates and succeeding substrates between a plurality of locations, said preceding substrates belonging to a preceding lot determined to follow a first transport sequence, said succeeding substrates belonging to a succeeding lot determined to follow a second transport sequence different from said first transport sequence, said preceding lot being immediately followed by said succeeding lot;

an element configured for judging whether or not interference occurs between the transport of said succeeding substrates and the transport of said preceding substrates under said transport plan;

an element configured for determining an objective substrate, said objective substrate being one of said succeeding substrates occupying a processing unit and causing said interference when transported out of said processing unit after being processed in said processing unit, if said interference is predicted; and an element configured for correcting said transport plan so as to execute a new transport cycle while causing said objective substrate to remain in said processing unit.

* * * * *